United States Patent
Atsatt et al.

(10) Patent No.: US 11,296,706 B2
(45) Date of Patent: Apr. 5, 2022

(54) EMBEDDED NETWORK ON CHIP ACCESSIBLE TO PROGRAMMABLE LOGIC FABRIC OF PROGRAMMABLE LOGIC DEVICE IN MULTI-DIMENSIONAL DIE SYSTEMS

(71) Applicant: Intel Corporation, Santa Clara, CA (US)

(72) Inventors: Sean R. Atsatt, Santa Cruz, CA (US); Scott J. Weber, Piedmont, CA (US); Ravi Prakash Gutala, San Jose, CA (US); Aravind Raghavendra Dasu, Milpitas, CA (US)

(73) Assignee: Intel Corporation, Santa Clara, CA (US)

( * ) Notice: Subject to any disclaimer, the term of this patent is extended or adjusted under 35 U.S.C. 154(b) by 752 days.

(21) Appl. No.: 16/020,748

(22) Filed: Jun. 27, 2018

(65) Prior Publication Data

US 2019/0044519 A1 Feb. 7, 2019

(51) Int. Cl.
*H03K 19/17772* (2020.01)
*H03K 19/1776* (2020.01)
*H03K 19/17768* (2020.01)
*H03K 19/17796* (2020.01)
*H03K 19/17758* (2020.01)

(52) U.S. Cl.
CPC ... *H03K 19/17758* (2020.01); *H03K 19/1776* (2013.01); *H03K 19/17768* (2013.01); *H03K 19/17772* (2013.01); *H03K 19/17796* (2013.01)

(58) Field of Classification Search
None
See application file for complete search history.

(56) References Cited

U.S. PATENT DOCUMENTS

| | | | |
|---|---|---|---|
| 8,719,753 B1 | 5/2014 | Chow et al. | |
| 10,505,548 B1 * | 12/2019 | Swarbrick | H03K 19/17768 |
| 2007/0088537 A1 | 4/2007 | Lertora et al. | |
| 2014/0281379 A1 | 9/2014 | Hutton et al. | |
| 2015/0109024 A1 | 4/2015 | Abdelfattah et al. | |
| 2017/0060212 A1 | 3/2017 | Kaushal et al. | |
| 2020/0264901 A1 * | 8/2020 | Camarota | H03K 19/17748 |

OTHER PUBLICATIONS

Extended European Search Report for EP Application No. 19175768.1 dated Nov. 25, 2019.

* cited by examiner

*Primary Examiner* — Anh Q Tran
(74) *Attorney, Agent, or Firm* — Fletcher Yoder, P.C.

(57) ABSTRACT

An integrated circuit device may include programmable logic fabric disposed on a first integrated circuit die, such that the programmable logic fabric may include a first region of programmable logic fabric and a second region of programmable logic fabric. The first region of programmable logic fabric is configured to be programmed with a circuit design that operates on a first set of data. The integrated circuit may also include network on chip (NOC) circuitry disposed on a second integrated circuit die, such that the NOC circuitry is configured to communicate data between the first integrated circuit die and the second integrated circuit die.

24 Claims, 25 Drawing Sheets

EMBEDDED NETWORK ON CHIP ACCESSIBLE TO PROGRAMMABLE LOGIC FABRIC OF PROGRAMMABLE LOGIC DEVICE IN MULTI-DIMENSIONAL DIE SYSTEMS

BACKGROUND

This disclosure relates to accessing a network on chip (NOC) in disposed in one die of a multi-dimensional die system using programmable logic fabric of a programmable logic device.

This section is intended to introduce the reader to various aspects of art that may be related to various aspects of the present disclosure, which are described and/or claimed below. This discussion is believed to be helpful in providing the reader with background information to facilitate a better understanding of the various aspects of the present disclosure. Accordingly, it may be understood that these statements are to be read in this light, and not as admissions of prior art.

Programmable logic devices are a class of integrated circuits that can be programmed to perform a wide variety of operations. A programmable logic device may include programmable logic elements programmed by a form of memory known as configuration random access memory (CRAM). Thus, to program a circuit design into a programmable logic device, the circuit design may be compiled into a bitstream and programmed into CRAM cells. The values programmed into the CRAM cells define the operation of programmable logic elements of the programmable logic device.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. Network on chip circuitry may be used by the programmable logic devices to communicate data throughout the programmable logic devices.

BRIEF DESCRIPTION OF THE DRAWINGS

Various aspects of this disclosure may be better understood upon reading the following detailed description and upon reference to the drawings in which.

DETAILED DESCRIPTION OF SPECIFIC EMBODIMENTS

Figure 1:
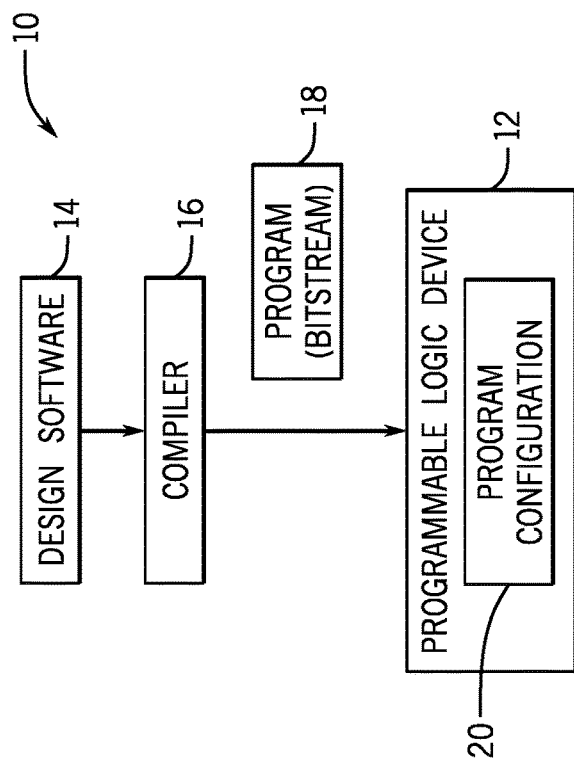
FIG. 1 is a block diagram of a programmable logic device that is programmed with a circuit design, in accordance with an embodiment.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase A "or" B is intended to mean A, B, or both A and B.

The highly flexible nature of programmable logic devices makes them an excellent fit for accelerating many computing tasks. Thus, programmable logic devices are increasingly used as accelerators for machine learning, video processing, voice recognition, image recognition, and many other highly specialized tasks, particularly those that would be too slow or inefficient in software running on a processor. In certain embodiments, as different sectors, portions, or regions of a programmable logic device are used to perform different operations, it may be useful to transfer data between the two sectors (e.g., regions). However, due to the limited space available on a fabric die that incorporates the programmable logic device, the performance impacts on the fabric die, the increased connectivity to the fabric die, and the like, it may be difficult to include a network-on-chip (NOC) circuit that facilitates the communication of data between various sectors, across different fabric die, between different programmable logic devices, and the like. For instance, placing the NOC in the fabric die interrupts the fabric die and reduces the performance capabilities of the fabric die.

With this in mind, in certain embodiments, the programmable logic device may be composed of at least two separate die. The programmable logic device may include a first die that contains primarily programmable logic fabric, and a second die that contains fabric support circuitry to support the operation of the programmable logic fabric. For example, the second die may contain at least some fabric support circuitry that may operate the programmable logic fabric (e.g., the fabric support circuitry of the second die may be essential to the operation of the programmable logic fabric of the first die).

In certain embodiments, a network on chip (NOC) may be embedded on second die that includes the fabric support circuitry to facilitate data communication between sectors (e.g., regions, portions) on the second die, between sectors on the first die, between sectors on the first die and the second die, and the like. The NOC of the fabric support circuitry may thus be used to provide an additional avenue for data transfers across the fabric via another die (e.g., base die) that may be communicatively coupled to the fabric. By incorporating the NOC into the fabric support circuitry, the NOC may resolve periphery shoreline bandwidth issues of the fabric, while increasing the bandwidth of the fabric. In addition, the communication routes available via the NOC embedded in the fabric support circuitry may enable the fabric to implement design relocations or reconfigurations, provide alternate pathways around powered-down sectors of the fabric, provide security isolation features, and increase the speed in which the fabric may be configured (e.g., less than 200 µs). Each of these features may not be available without using the NOC in the fabric support circuitry because the above-referenced limitations of the fabric would prevent the fabric from including the infrastructure or network-on-chip to communicate data across the fabric in this manner.

In addition to the NOC, the fabric support circuitry may, in certain embodiments, may include, among other things, a device controller (sometimes referred to as a secure device manager (SDM)), a sector controller (sometimes referred to as a local sector manager (LSM), region controller), a configuration network on chip (CNOC), data routing circuitry, local (e.g., sectorized, sector-aligned, region-aligned) memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, or electrostatic discharge circuitry, to name just a few circuit elements that may be present on the second die. With this in mind, by including the NOC in the fabric support circuitry, the first die may entirely or almost entirely contain programmable logic fabric, and the second die may contain all or almost all of the fabric support circuitry that controls the programmable logic fabric because the NOC may enable data to be accessible across the first die and the second die.

By way of introduction, FIG. 1 illustrates a block diagram of a system 10 that may employ a programmable logic device 12 that can communicate via a network-on-chip disposed on a separate die that does not include programmable logic fabric, in accordance with embodiments presented herein. Using the system 10, a designer may implement a circuit design functionality on an integrated circuit, such as a reconfigurable programmable logic device 12, such as a field programmable gate array (FPGA). The designer may implement a circuit design to be programmed onto the programmable logic device 12 using design software 14, such as a version of Intel® Quartus® by Intel Corporation of Santa Clara, Calif. The design software 14 may use a compiler 16 to generate a low-level circuit-design defined by bitstream 18, sometimes known as a program object file and/or configuration program, that programs the programmable logic device 12. Thus, the compiler 16 may provide machine-readable instructions representative of the circuit design to the programmable logic device 12. For example, the programmable logic device 12 may receive one or more configuration programs (bitstreams) 18 that describe the hardware implementations that should be stored in the programmable logic device 12. A configuration program (e.g., bitstream) 18 may be programmed into the programmable logic device 12 as a configuration program 20. The configuration program 20 may, in some cases, represent an accelerator function to perform for machine learning, video processing, voice recognition, image recognition, or other highly specialized task.

To carry out the systems and methods of this disclosure, the programmable logic device 12 may take any suitable form that includes a network-on-chip (NOC) providing the ability to communicate data across the sectors of the programmable logic device 12. As such, in one embodiment, the programmable logic device 12 may have two separate integrated circuit die where at least some of the programmable logic fabric is separated from at least some of the fabric support circuitry that operates the programmable logic fabric, which may include the NOC.

Figure 2:
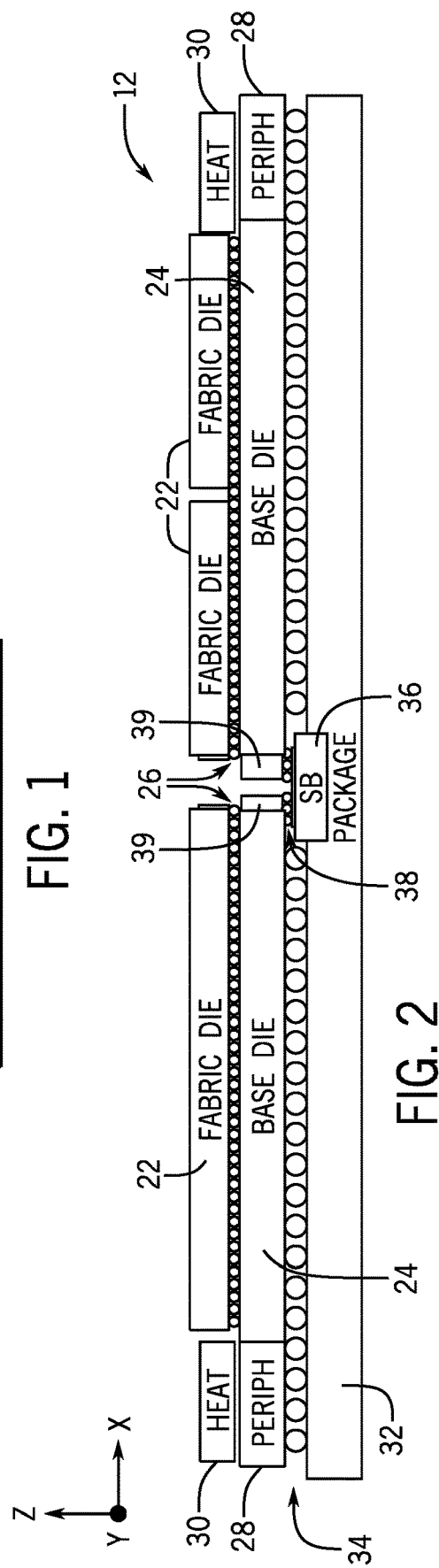
FIG. 2 is a block diagram of a package including the programmable logic device where a fabric die is vertically stacked with a base die, in accordance with an embodiment.

One example of the programmable logic device 12 is shown in FIG. 2, but any suitable programmable logic device may be used. In the example of FIG. 2, the programmable logic device 12 includes a fabric die 22 and a base die 24 that are connected to one another via microbumps 26. Although the fabric die 22 and base die 24 appear in a one-to-one relationship in FIG. 2, other relationships may be used. For example, a single base die 24 may attach to several fabric die 22, or several base die 24 may attach to a single fabric die 22, or several base die 24 may attach to several fabric die 22 (e.g., in an interleaved pattern along the x- and/or y-direction). Peripheral circuitry 28 may be attached to, embedded within, and/or disposed on top of the base die 24, and heat spreaders 30 may be used to reduce an accumulation of heat on the programmable logic device 12. The heat spreaders 30 may appear above, as pictured, and/or below the package (e.g., as a double-sided heat sink). The base die 24 may attach to a package substrate 32 via C4 bumps 34. In the example of FIG. 2, two pairs of fabric die 22 and base die 24 are shown communicatively connected to one another via a silicon bridge 36 (e.g., an embedded multi-die interconnect bridge (EMIB)) and microbumps 38 at a silicon bridge interface 39.

Although the microbumps 26 and the microbumps 38 are described as being employed between the fabric die 22 and the base die 24 or between the edge devices, such as the silicon bridge 36 and the silicon bridge interface 39, it should be noted that microbumps may be employed at any suitable position between the components of the programmable logic device 12. For example, the microbumps may be incorporated in any suitable position (e.g., middle, edge, diagonal) between the fabric die 22 and the base die 24. In the same manner, the microbumps may be incorporated in any suitable pattern or amorphous shape to facilitate interconnectivity between various components (e.g., NOC) described herein.

Figure 3:
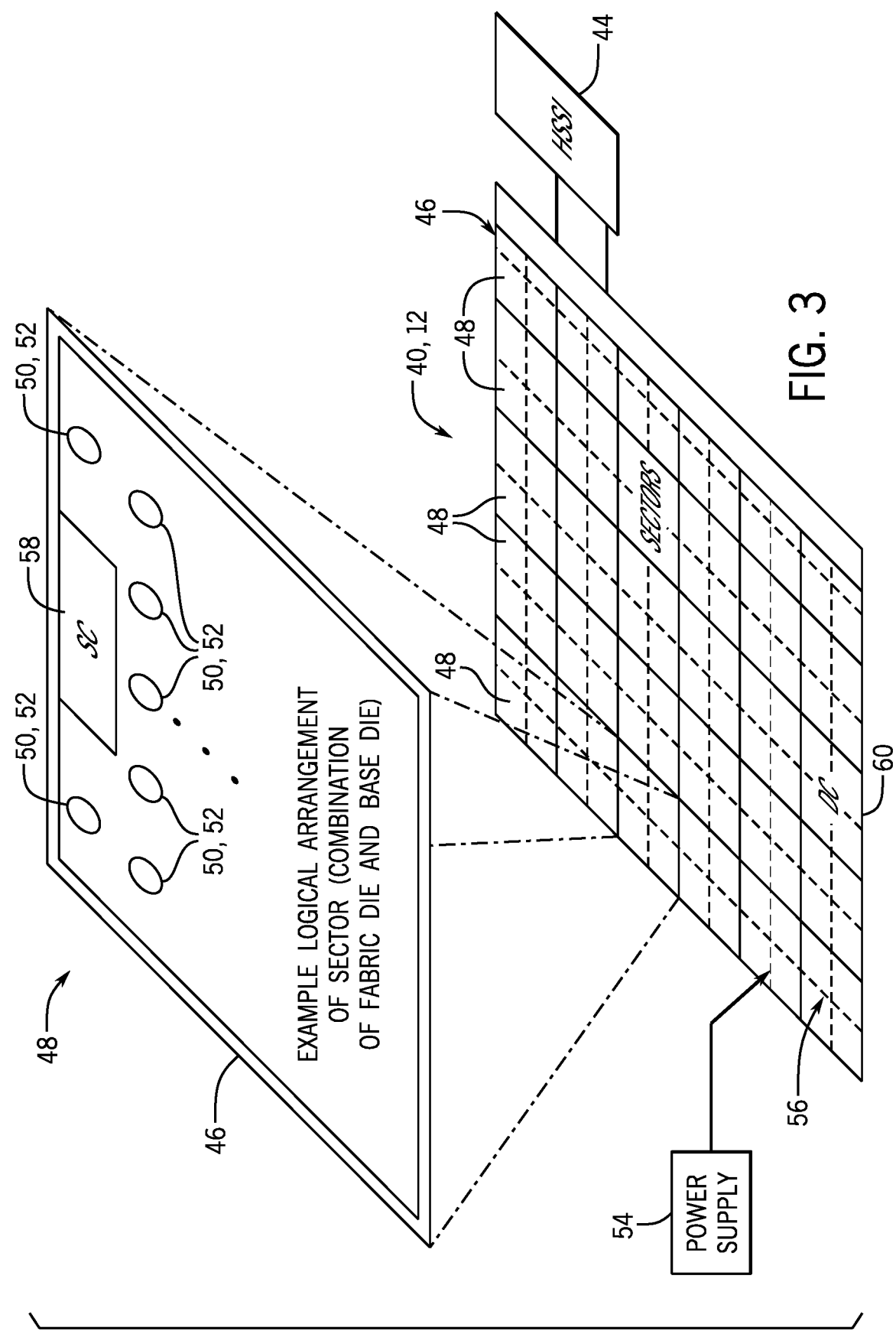
FIG. 3 is a block diagram of an example logical arrangement of the programmable logic device, in accordance with an embodiment.

In combination, the fabric die 22 and base die 24 may operate as a programmable logic device such as a field programmable gate array (FPGA). For example, the fabric die 22 and the base die 24 may operate in combination as an FPGA 40, shown in FIG. 3. It should be understood that the FPGA 40 shown in FIG. 3 is meant to represent the type of circuitry and/or a logical arrangement of a programmable logic device when the both the fabric die 22 and the base die 24 operate in combination. In other words, some of the circuitry of the FPGA 40 shown in FIG. 3 may be found in the fabric die 22 and some of the circuitry of the FPGA 40 shown in FIG. 3 may be found in the base die 24. Moreover, for the purposes of this example, the FPGA 40 is referred to as an FPGA, though it should be understood that the device may be any suitable type of programmable logic device (e.g., an application-specific integrated circuit and/or application-specific standard product).

In the example of FIG. 3, the FPGA 40 may include transceiver circuitry (HSSI) 44 for driving signals off of the FPGA 40 and for receiving signals from other devices. The transceiver circuitry (HSSI) may be part of the fabric die 22, the base die 24, or a separate die altogether. Interconnection resources 46 may be used to route signals, such as clock or data signals, through the FPGA 40. The FPGA 40 of FIG. 3 is shown to be sectorized, meaning that programmable logic resources may be distributed through a number of discrete programmable logic sectors 48 (e.g., region, portion). Each programmable logic sector 48 may include a number of programmable logic elements 50 (also referred herein as FPGA fabric 50) having operations defined by configuration memory 52 (e.g., configuration random access memory (CRAM)). The programmable logic elements 50 may include combinational or sequential logic circuitry. For example, the programmable logic elements 50 may include look-up tables, registers, multiplexers, routing wires, and so forth. A designer may program the programmable logic elements 50 to perform a variety of desired functions. A power supply 54 may provide a source of voltage and current to a power distribution network (PDN) 56 that distributes electrical power to the various components of the FPGA 40. Operating the circuitry of the FPGA 40 causes power to be drawn from the power distribution network 56.

There may be any suitable number of programmable logic sectors 48 on the FPGA 40. Indeed, while 29 programmable logic sectors 48 are shown here, it should be appreciated that more or fewer may appear in an actual implementation (e.g., in some cases, on the order of 50, 100, or 1000 sectors or more). Each programmable logic sector 48 may include a sector controller (SC) 58 that controls the operation of the programmable logic sector 48. Each sector controller 58 may be in communication with a device controller (DC) 60. Each sector controller 58 may accept commands and data from the device controller 60 and may read data from and write data into its configuration memory 52 based on control signals from the device controller 60. In addition to these operations, the sector controller 58 and/or device controller 60 may be augmented with numerous additional capabilities. Such capabilities may include coordinating memory transactions between local in-fabric memory (e.g., local fabric memory or CRAM being used for data storage) via the NOC, transactions between sector-aligned memory associated with that particular programmable logic sector 48 via the NOC, decrypting configuration data (bitstreams) 18, and locally sequencing reads and writes to implement error detection and correction on the configuration memory 52, and sequencing test control signals to effect various test modes.

The sector controllers 58 and the device controller 60 may be implemented as state machines and/or processors. For example, each operation of the sector controllers 58 or the device controller 60 may be implemented as a separate routine in a memory containing a control program. This control program memory may be fixed in a read-only memory (ROM) or stored in a writable memory, such as random-access memory (RAM). The ROM may have a size larger than would be used to store only one copy of each routine. This may allow each routine to have multiple variants depending on "modes" the local controller may be placed into. When the control program memory is implemented as random access memory (RAM), the RAM may be written with new routines to implement new operations and functionality into the programmable logic sectors 48. This may provide usable extensibility in an efficient and easily understood way. This may be useful because new commands could bring about large amounts of local activity within the sector at the expense of only a small amount of communication between the device controller 60 and the sector controllers 58.

Each sector controller 58 thus may communicate with the device controller 60, which may coordinate the operations of the sector controllers 58 and convey commands initiated from outside the FPGA device 40. To support this communication, the interconnection resources 46 may act as a network between the device controller 60 and each sector controller 58. The interconnection resources may support a wide variety of signals between the device controller 60 and each sector controller 58. In one example, these signals may be transmitted as communication packets.

The FPGA 40 may be electrically programmed. With electrical programming arrangements, the programmable elements 50 may include one or more logic elements (wires, gates, registers, etc.). For example, during programming, configuration data is loaded into the configuration memory 52 using pins 44 and input/output circuitry 42. In one example, the configuration memory 52 may be implemented as configuration random-access-memory (CRAM) cells. The use of configuration memory 52 based on RAM technology is described herein is intended to be only one example. Moreover, configuration memory 52 may be distributed (e.g., as RAM cells) throughout the various programmable logic sectors 48 the FPGA 40. The configuration memory 52 may provide a corresponding static control output signal that controls the state of an associated programmable logic element 50 or programmable component of the interconnection resources 46. The output signals of the configuration memory 52 may configure the may be applied to the gates of metal-oxide-semiconductor (MOS) transistors that control the states of the programmable logic elements 50 or programmable components of the interconnection resources 46.

As stated above, the logical arrangement of the FPGA 40 shown in FIG. 3 may result from a combination of the fabric die 22 and base die 24. The circuitry of the fabric die 22 and base die 24 may be divided in any suitable manner. In one example, shown in block diagram form in FIG. 4, the fabric die 22 contains primarily programmable logic fabric resources, such as the programmable logic elements 50 and configuration memory 52. In some cases, this may also entail certain fabric control circuitry such as the sector controller (SC) 58 or device controller (DC) 60. The base die 24 may include supporting circuitry to operate the programmable logic elements 50 and configuration memory 52. Shown here, the base die 24 includes sector 1 support circuitry 70A and sector 2 support circuitry 70B to support two corresponding sectors of the programmable logic elements 50 and configuration memory 52 of the fabric die 22. The base die 24 may also include support circuitry for other sectors of the fabric die 22.

Thus, while the fabric die 22 may include primarily programmable logic fabric resources, such as the programmable logic elements 50 and configuration memory 52, the base die 24 may include, among other things, a device controller (DC) 60, a sector controller (SC) 58, a network-on-chip (NOC), a configuration network on chip (CNOC), data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, to name just a few elements that may be present on the base die 24. It should be understood that some of these elements that may be part of the fabric support circuitry of the base die 24 may additionally or alternatively be a part of the fabric die 22. For example, the device controller (DC) 60 and/or the sector controllers (SC) 58 may be part of the fabric die 22.

Figure 4:
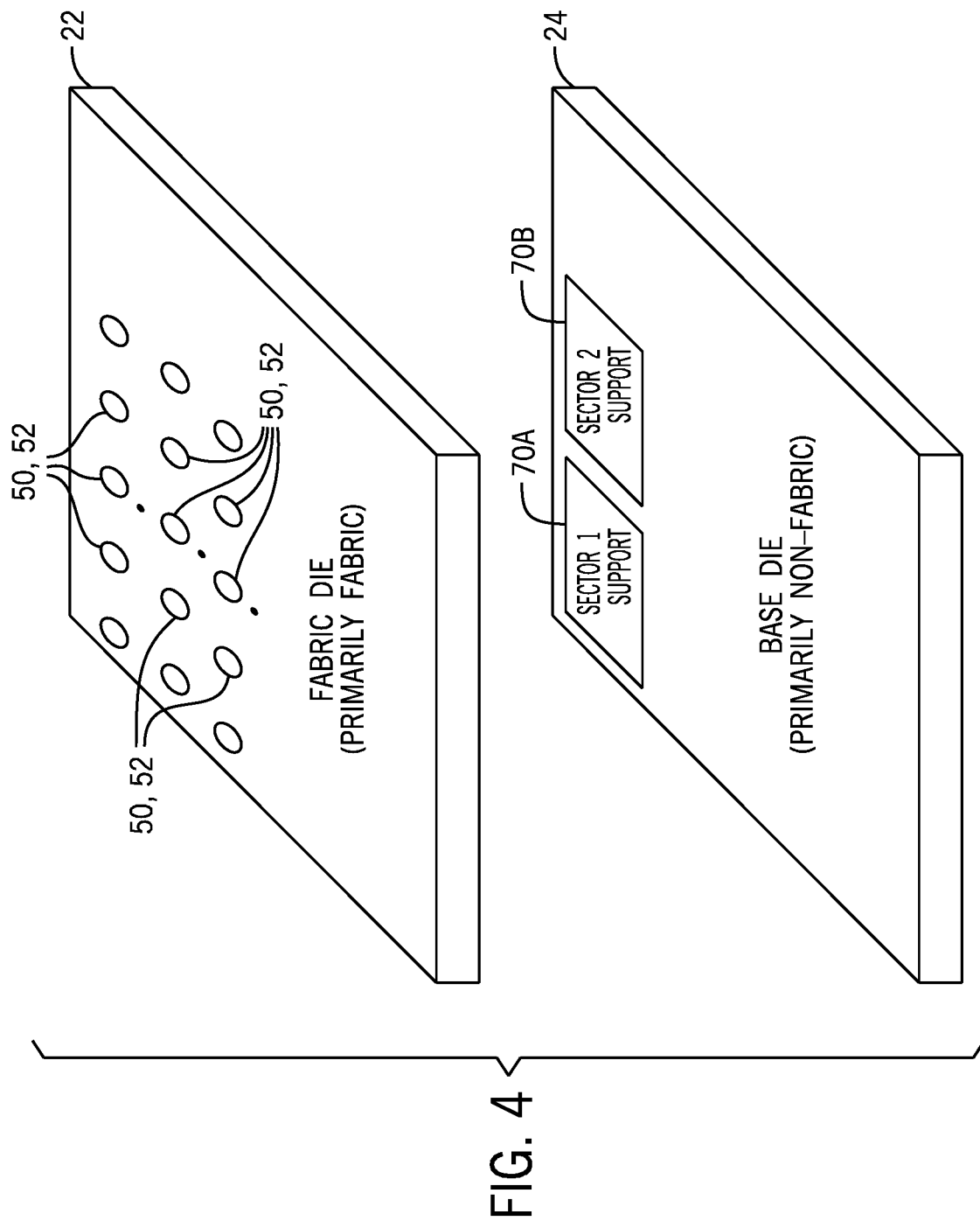
FIG. 4 is a block diagram showing a fabric die of the programmable logic device that contains programmable logic fabric and a base die of the programmable logic device that contains primarily non-fabric circuitry that operates the programmable logic fabric, in accordance with an embodiment.

While FIG. 4 represents an example where the fabric die 22 contains primarily programmable logic fabric, with most other components located in the base die 24, the fabric die 22 may contain some of the other components to support the programmable logic fabric. Thus, in some embodiments, the fabric die 22 or the base die 24 may include one or more of a device controller (DC) 60, a sector controller (SC) 58, a network-on-chip (NOC), a configuration network on chip (CNOC), data routing circuitry, sector-aligned memory used to store and/or cache configuration programs (bitstreams) or data, memory controllers used to program the programmable logic fabric, input/output (I/O) interfaces or modules for the programmable logic fabric, external memory interfaces (e.g., for a high bandwidth memory (HBM) device), an embedded processor (e.g., an embedded Intel® Xeon® processor by Intel Corporation of Santa Clara, Calif.) or an interface to connect to a processor (e.g., an interface to an Intel® Xeon® processor by Intel Corporation of Santa Clara, Calif.), voltage control circuitry, thermal monitoring circuitry, decoupling capacitors, power clamps, and/or electrostatic discharge (ESD) circuitry, and other elements.

Figure 5:
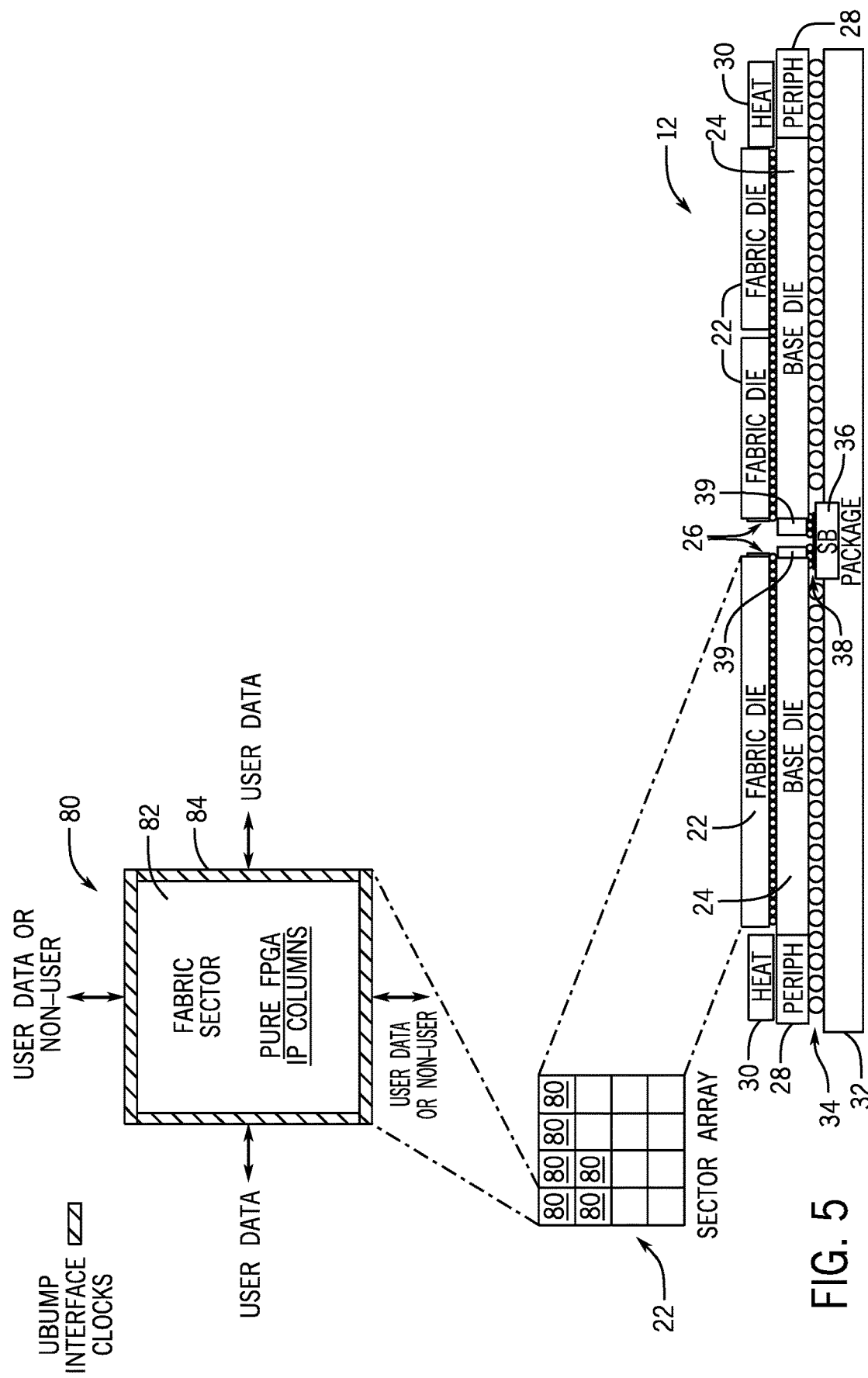
FIG. 5 is a block diagram of an example topology of the fabric die, in accordance with an embodiment.
Figure 6:
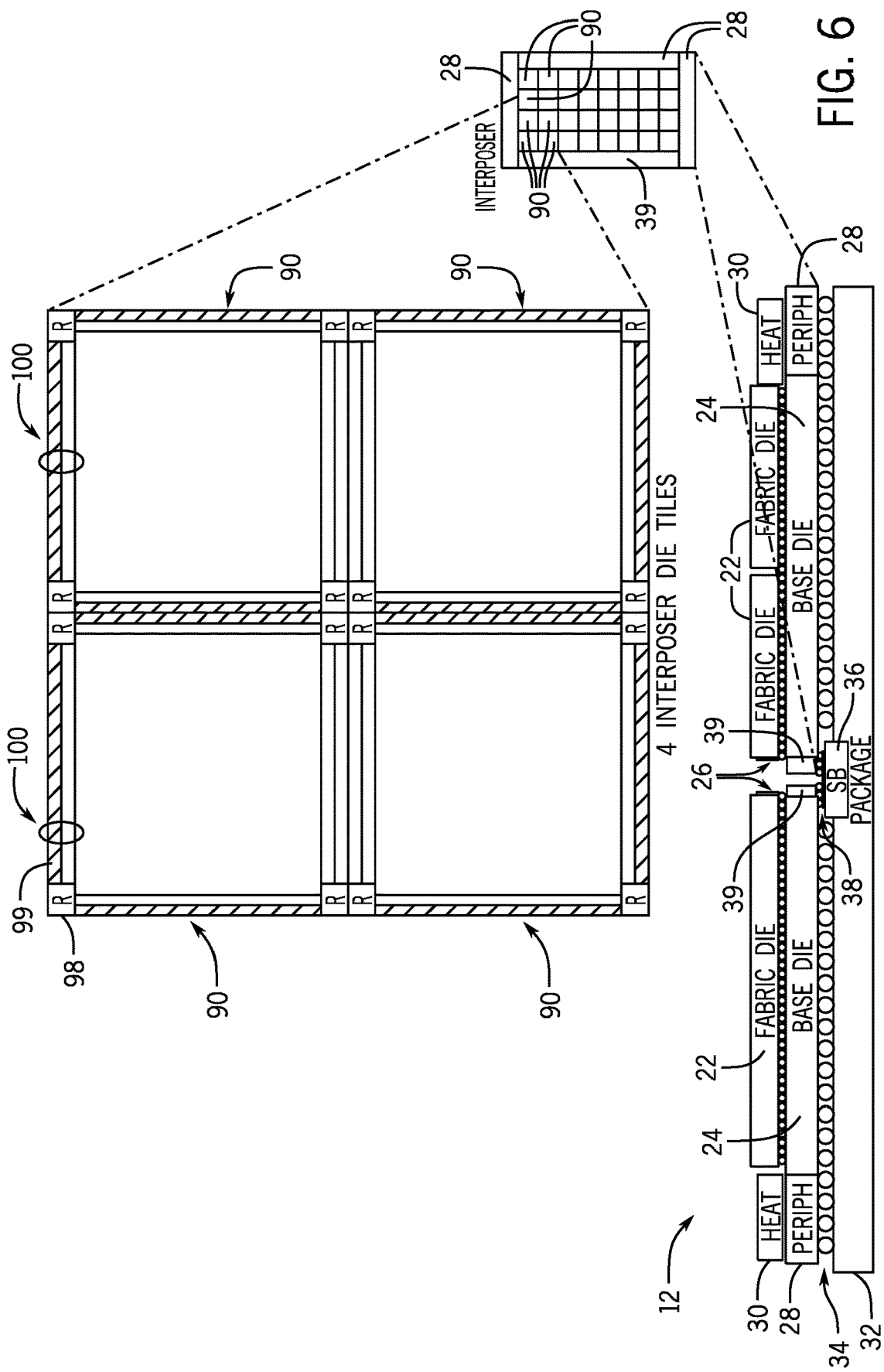
FIG. 6 is a block diagram of an example topology of the base die having an embedded network-on-chip NOC, in accordance with an embodiment.

One example physical arrangement of the fabric die 22 and the base die 24 is shown by FIGS. 5 and 6. In FIG. 5, the fabric die 22 is shown to contain an array of fabric sectors 80 that include fabric resources 82 (e.g., programmable elements programmed by CRAM and/or certain fabric control circuitry such as the sector controller (SC) 58 or device controller (DC) 60) and interface circuitry 84. The interface circuitry 84 may include data routing and/or clocking resources or may include an interface to data routing and/or clocking resources on the base die 24. Thus, the interface circuitry 84 may connect with a micro-bump (ubump) interface to connect to the base die 24.

FIG. 6 provides an example complementary arrangement of the base die 24. The base die 24 may represent an active interposer with several sectors 90 surrounded by peripheral circuitry 28 and the silicon bridge interface 39. Although not shown in FIG. 6, each sector 90 may include a variety of fabric support circuitry, which may described in greater detail below. In any case, the base die 24, in some embodiments, may include data and/or configuration routers 98, and/or data or configuration pathways 99. In some embodiments, portions of the data or configuration pathways 99 may communicate data in one direction, while other portions may communicate data in the opposite direction. In other embodiments, the data or configuration pathways 99 may communicate data bi-directionally.

With the foregoing in mind, the data and/or configuration pathways 99 may make up a network on chip (NOC) system 100. In the embodiment depicted in FIG. 6, the NOC system 100 may be integrated between each sector 90 of the base die 24. As such, the NOC system 100 may enable each of the sectors 90 disposed on the base die 24 to be accessible to each other. Indeed, the NOC system 100 may provide communication paths between each sector 90 via routers 98 or the like. In certain embodiments, the routers 98 may route user data between sectors 90 of the base die 24, to sectors 48 of the fabric die 22, and the like. Since the base die 24 is separate from the fabric die 22, the NOC system 100 may be continuously powered on, even when various sectors 48 of the fabric die 22 are powered down. In this way, the NOC system 100 of the base die 24 may provide an available route to different sectors 48 of the fabric die 22 regardless of the positions of powered down sectors 48.

In some embodiments, the NOC system 100 may include features such as Quality of Service management, Security Management, Debug and Performance measurement and Address virtualization services, and the like. In addition, the NOC system 100 may support caching features and interconnect protocols allowing the memory components of the programmable logic device 12 to be part of a coherent memory system supported by a caching agent.

By vertically aligning the fabric die 22 and the base die 24, the NOC 100 disposed on the base die 24 may physically span across the same surface area of the fabric die 22. In certain embodiments, microbumps may be positioned at various locations between the base die 24 and the fabric die 22 to enable the NOC 100 to communicate data between sectors 90 of the base die and sectors 48 of the fabric die 22. In the example embodiment of the NOC 100 depicted in FIG. 6, the NOC 100 may be positioned around each sector 90, which may be aligned with a corresponding sector 48 of the fabric die 22. As such, the NOC 100 may provide additional horizontal and vertical routing wires or pathways to facilitate to communication between sectors 48 of the fabric die 22, between sectors 90 of the base die 24, or between sectors 48 of the fabric die 22 and sectors 90 of the base die 24. The additional horizontal and vertical lines provided by the NOC 100 may reduce the amount of quantization performed by the programmable logic device 12.

Figure 7:
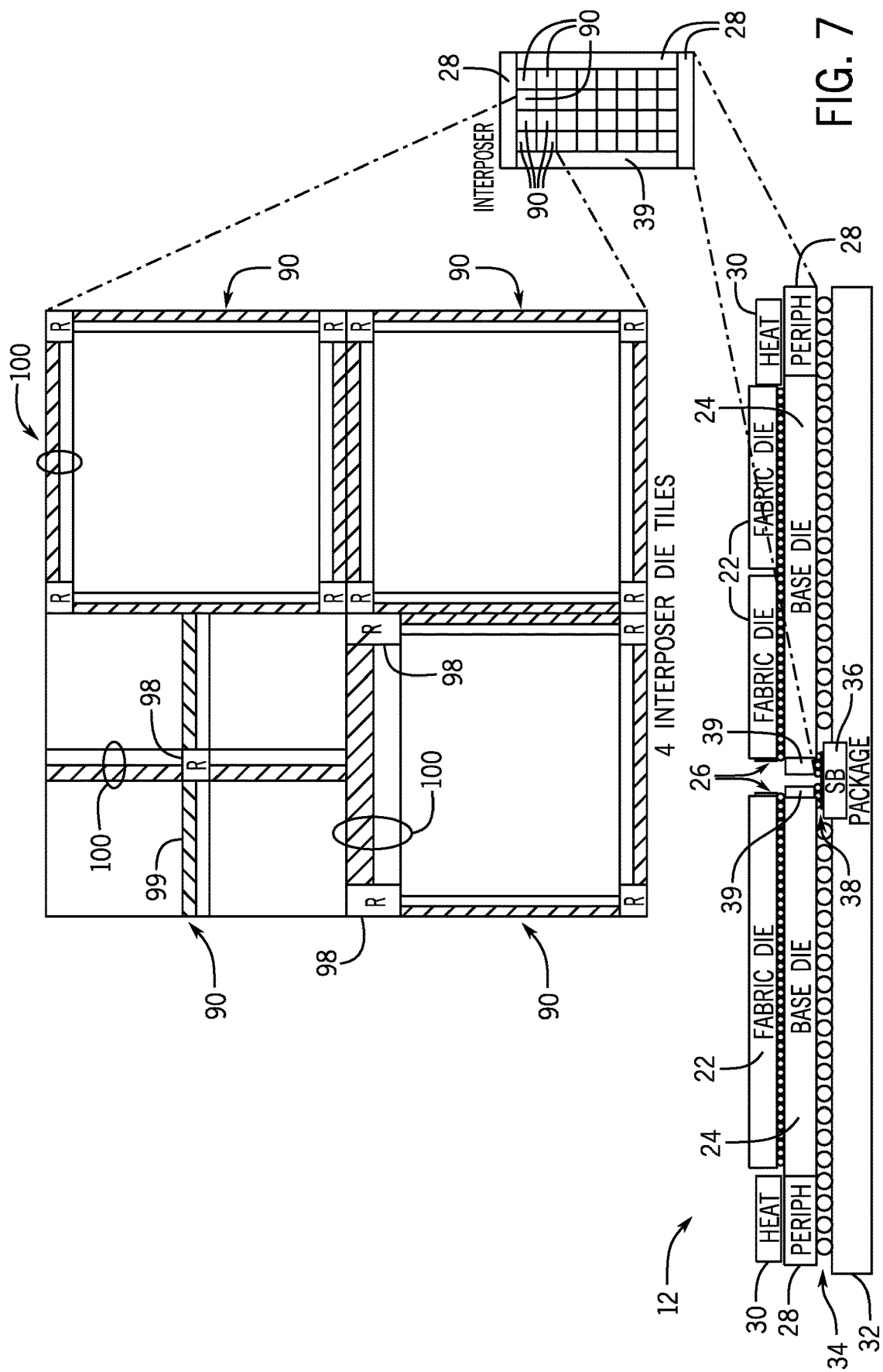
FIG. 7 is a block diagram of an example topology of the base die having different configurations of the embedded network-on-chip NOC, in accordance with an embodiment.

Although the data or configuration pathways 99 of the NOC 100 is illustrated in FIG. 6 as being routed around the sectors 90 of the base die 24, it should be noted that data or configuration pathways 99 of the NOC 100 may be routed across the base die 24 in any suitable manner. By way of example, FIG. 7 illustrate the NOC 100 implemented with data or configuration pathways 99 disposed across the center of the sector 90. As such, the router 98 may also be positioned in the center of the sector 90.

In addition, in some embodiments, the data or configuration pathways 99 of the NOC 100 may be wider in certain sectors 90 as compared to other sectors 90. In any case, it should be understood that the data or configuration pathways 99 may be incorporated into the base die 24, such that serve desired functions or operations that may be specific to the operations performed by the programmable logic device 12. That is, if the programmable logic device 12 includes functions that involve regularly transferring data across the fabric die 22, it may be beneficial to use more the base die 24 space to include data or configuration pathways 99 that take up more space on the base die 24 to provide increased bandwidth.

With the foregoing in mind, the NOC system 100 may include the data or configuration pathways 99 that allow for efficient multi-dimensional (e.g., three-dimensional, two-dimensional) integration of the NOC system 100 on the programmable logic device 12. Indeed, the NOC system 100 may enable the fabric die 22 to connect to the peripheral circuitry 28 and other parts of the fabric without communicating via the fabric die 22 or the programmable logic sectors 48 of the fabric die 22. That is, by employing the NOC system 100 in the base die 24, the programmable logic device 12 may increase the available bandwidth for communication across the programmable logic sectors 48 because the NOC system 100 provides additional pathways to different parts of the programmable logic device 12.

Figure 9:
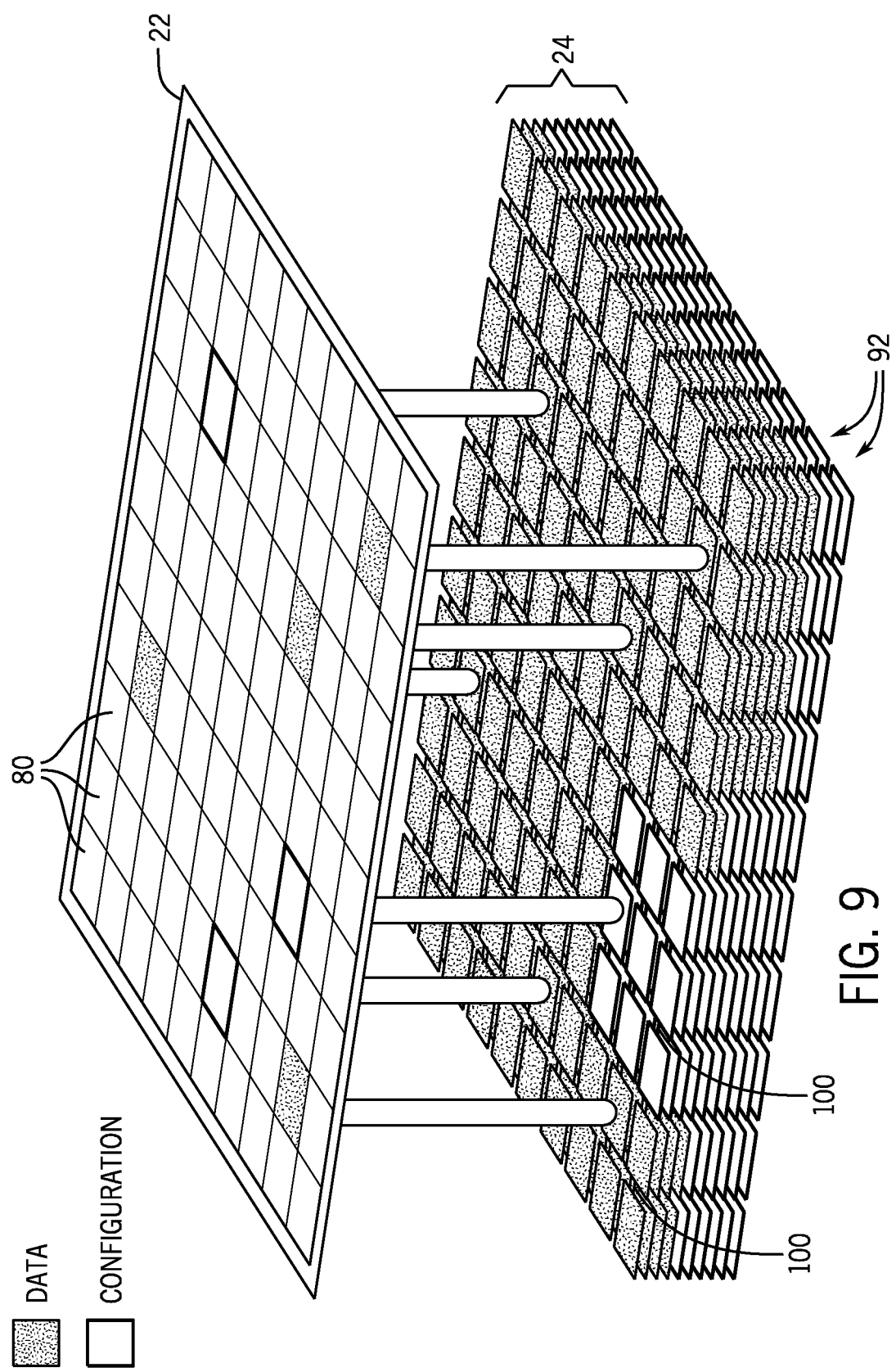
FIG. 9 is a schematic block diagram of sector-aligned memory having embedded network on chip (NOC) circuitry of the base die that may support rapid configuration and/or caching for corresponding sectors of the fabric die, in accordance with an embodiment.

In addition, the NOC 100 resolves shoreline issues, supports fast reconfiguration, and enables relocate-ability of functions in the programmable logic sectors 48 based on the increased bandwidth and accessibility to different portions of the fabric die 22 via the base die 24. That is, as shown in FIG. 9, the NOC system 100 may be integrated between the sector-aligned memory 92 of the base die 24, such that it spans across the entire base die 24. As such, the NOC system 100 may access different fabric sectors 80 via various routes in the base die 24. In addition, the additional routes enable the NOC system 100 to serve as functional bypass around powered down sectors 80 without affecting the performance of the programmable logic device 12 by avoiding blockages across the programmable logic sectors 48 of the programmable logic device 12. That is, in some situations, certain sectors 80 of the fabric die 22 may be powered down, thereby preventing communication across the powered down sectors 80. In this case, the NOC system 100 may provide alternate communication pathways around the powered down sectors 80 to maintain communicative connectedness across the sectors 80 of the fabric die 22 regardless of whether certain sectors 80 are powered down.

The design relocate-ability of the programmable logic sectors 48 is also enhanced by the NOC system 100 because the NOC system 100 may access different sectors 80 of the fabric die 22. That is, the increased communication flexibility provided by the NOC system 100 being disposed in the base die 24 enables the programmable logic sectors 48 to be repositioned in various sectors 80 of the fabric die 22, while maintaining communication capabilities between the relocated programmable logic sectors 48.

In certain embodiments, the NOC system 100 may also enable the programmable logic device 12 to provide security isolation for one or more of the programmable logic sectors 48. That is, the NOC system 100 may be employed to communicate certain sensitive or secure data to a portion of programmable logic sectors 48 that may be designated as a security portion of the programmable logic device 12. Third party programmers may be unable to access the security portion of the programmable logic device 12 without access to the NOC system 100. Instead, the NOC system 100 may be limited to communication by certain programmers with a level of security credentials.

Although FIGS. 6 and 7 illustrate three embodiments in which the NOC 100 may be configured, it should be noted that the base die 24 may be configured to include a data or configuration pathways 99 in a variety of shapes, forms, positions, and the like. For example, the data or configuration pathways 99 of different sectors 90 may overlap each other, the entire sector 90 may incorporate the data or configuration pathway 99, or the like. In addition, microbumps may be used to facilitate communication between the NOC 100 and various sectors 80 of the fabric die 22 and the like.

Figure 8:
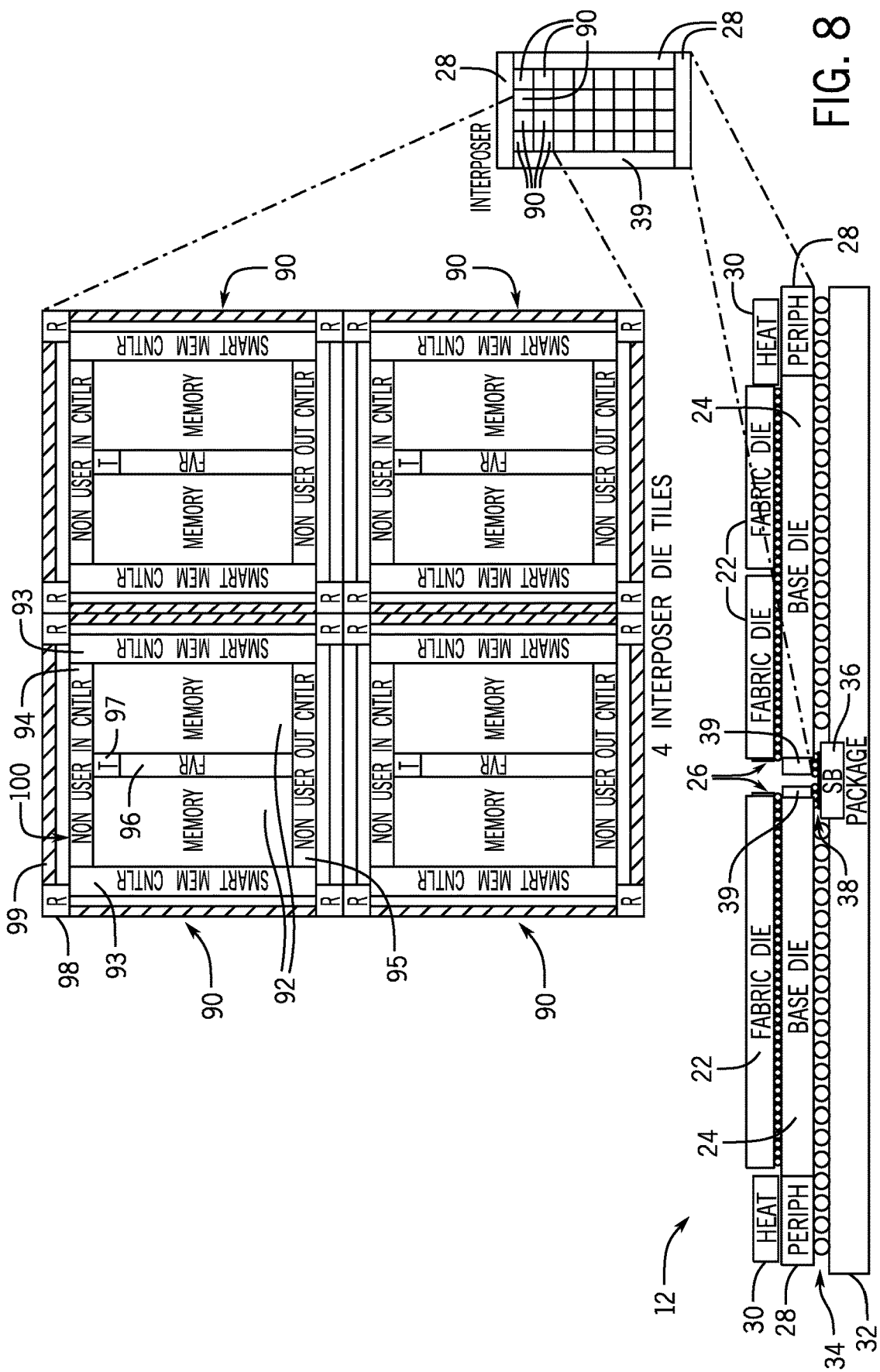
FIG. 8 is a block diagram of an example topology of the base die having an embedded network-on-chip NOC integrated with a sector-aligned memory, in accordance with an embodiment.

In addition to facilitating communication of data between sectors 90, sectors 80, and the like, the presence of the NOC 100 in the base die 24 may also provide the programmable logic device 12 to incorporate additional circuit features by leveraging the NOC 100 of the base die 24 to improve the communication across the fabric die 22. By way of example, FIG. 8 provides another embodiment of an arrangement of the base die 24. Similar to the base die 24 described above, the base die 24 of FIG. 8 may represent an active interposer with several sectors 90 surrounded by peripheral circuitry 28 and the silicon bridge interface 39. As shown in FIG. 8, each sector 90 may include a variety of fabric support circuitry, such as sector-aligned memory 92, memory control circuitry 93, non-user input control circuitry 94, non-user output control circuitry 95, a voltage regulator such as a fully integrated voltage regulator (FIVR) 96, one or more thermal sensors 97, data and configuration routers 98, and/or data or configuration pathways 99.

Although the following description of the additional circuit features enabled by the NOC 100 embedded in the base die 24 focuses on the ability to transfer data to and from the sector-aligned memory 92, it should be noted that the additional circuit features are not limited to technologies involving the sector-aligned memory 92. Indeed, the NOC 100 embedded in the base die 24 may enable a variety of circuit operations to be performed more efficiently and effectively via the programmable logic device 12. However, for the purposes of discussion, certain operations that involve the sector-aligned memory 92 and the NOC 100 will be described to illustrate some of the functions enabled by incorporating the NOC 100 into the base die 24.

Referring back to FIG. 8, the memory control circuitry 93 may be used to program the sector-aligned memory 92, the CRAM of the fabric die 22, or both. The non-user input control circuitry 94 and non-user output control circuitry 95 may allow the circuitry of the sectors 90 to exchange data and/or control signals (e.g., via configurable data routing network-on-chip (NOC) or a configuration network on chip (CNOC)). In one example, the non-user input control circuitry 94 and non-user output control circuitry 95 may operate as the sector controller (SC) 58 for a corresponding fabric sector 80 (as shown in FIG. 5).

The FIVR 96 and the one or more thermal sensors 97 may be used to provide a desired voltage to the corresponding fabric sector 80 (as shown in FIG. 5), enabling the voltage to be selectively scaled up or down, or removed, depending on power and thermal specifications (e.g., based at least in part on temperature as measured by a thermal sensor 97 and/or in accordance with a dynamic voltage and frequency scaling (DVFS) scheme). Even though the thermal sensors 97 are in a separate die from that of the programmable logic fabric elements, when the base die 24 is directly adjacent to the fabric die 22 as in this example, the temperature measured by the thermal sensor 97 in the base die 24 may correspond well enough to the fabric die 22 to allow for temperature-based operations (e.g., turn off power to the corresponding fabric sector 80 to prevent a permanent-denial-of-service (PDOS) condition).

In certain embodiments, the data or configuration pathways 99 that make up the NOC system 100 may provide communication paths between each sector 90 via routers 98 mentioned above. As shown in FIG. 9, by vertically aligning the fabric die 22 and the base die 24 and incorporating the NOC 100 in the base die 24, memory located in the base die 24 may be accessible in parallel to fabric sectors 80 of the fabric die 22. FIG. 9 shows an example in which sector-aligned memory 92 may be contained in the base die 24. The sector-aligned memory 92 may be directly accessible to respective fabric sectors 80 of the fabric die 22 and may contain user data (generated by or accessible by a circuit design programmed into the programmable logic fabric of the base die 24) or configuration data that may be used to program the programmable logic fabric of the base die 24. In this disclosure, "directly accessible" refers to a connection between a region of the sector-aligned memory 92 that is associated with a particular fabric sector 80 and that particular fabric sector 80. In some embodiments, each respective region of the sector-aligned memory 92 associated with a particular fabric sector 80 may be directly accessible to that particular fabric sector 80, thereby providing each fabric sector 80 with direct access to that region of the sector-aligned memory 92. For example, there may be N regions of sector-aligned memory 92 that can be accessible by N corresponding fabric sectors 80 at the same time (e.g., in parallel). In some cases, the sector-aligned memory 92 may be accessible to more than one fabric sector 80 or multiple sectors of sector-aligned memory 92 may be accessible to a single fabric sector 80. Thus, in some cases, the same region of sector-aligned memory 92 may be directly accessible to multiple fabric sectors 80, while in other cases, a region of sector-aligned memory 92 may be directly accessible only to a single fabric sector 80. In the example of FIG. 9, the fabric sectors 80 may access specific regions of sector-aligned memory 92. The sector-aligned memory 92 is shown in FIG. 9 as vertically stacked memory. This may allow a large amount of memory to be located within the base die 24. However, the sector-aligned memory 92 may occupy a single plane of the base die 24 in some embodiments.

As mentioned above, to facilitate the use of the sector-aligned memory 92, the embedded NOC 100 may enable configuration data and user data to be communicated between memory components of the sector-aligned memory 92, between the sectors 48 or other components (e.g., CRAM) of the fabric die 22 and a component in the sector-aligned memory 92, and the like. Additional details with regard to how the NOC 100 may communicate with the CRAM of the fabric die 22, memory components of the fabric die 22, sectors 44 of the fabric die 22, and the like will be provided below with reference to FIGS. 14-35.

Referring again to FIG. 8, to facilitate communication between the fabric die 22 and the base die 24, the NOC system 100 may employ the memory control circuitry 93 to control ingress and egress of data between the NOC system 100 to sector-aligned memory 92 on the base 24. That is, the memory control circuitry 93 may enables DMA and other memory operations, such as data operations onto and off of the NOC system 100, as well as providing access to sector-aligned memory 92 via the microbumps 26.

Ingress and egress operations from the NOC system 100 to and from the microbumps 26 is designed to support mapping connections via the NOC system 100 through the microbumps 26 to a variety of destinations. For example, direct parallel or serial connection to the sector input data register of each sector 48 (e.g., part of non-user input control circuitry 94) may be accessible to the NOC system 100 via the microbumps 26. In addition, H/V wires of the programmable logic device 12 with a hardware programmable protocol adapter in a ubump interface in the base die 24 that may map wires coming through the microbumps 26 to a user selectable level of protocol including, but not limited to, AXI-4 and Avalon MM. Further, direct parallel or serial connections to the sector output data register (e.g., part of non-user input control circuitry 94) may be employed for trace, debug, and test data.

In some embodiments, the NOC system 100 may be split into different portions that facilitate user data and other portions that facilitate non-user data. The user data may be routed to the peripheral circuitry 28 and other programmable logic sectors 48 of the fabric die 22 at approximately 512 Gbps. The non-user data communicated via the other portion of the NOC system 100 may be used for fast configuration operations from high bandwidth/medium (HBM), double data rate (DDR), and Xeon components at approximately 128 Gbps.

The NOC system 100 may connect to the peripheral circuitry 28 via adapters designed to support connections to the peripheral circuitry 28. For example, a serial periphery circuit, such as, but not limited to, PCIe and Ethernet, may connects into the NOC system 100 via destination decoders, which examine a packet and determine which stop on the NOC system 100 is the data to be sent to. Other types of the peripheral circuitry 28 may include memory or other protocol interfaces through stops designed to adapt the NOC transactions to a periphery protocol.

In some embodiments, the programmable logic device 12 may include circuit designs that define an accelerator function may benefit from access to a large amount of data stored in memory. Since accessing an external memory device may be a relatively slow process, and the capacity of memory in the fabric die 22 may be limited, the NOC 100 may enable the fabric die 22 to access sector-aligned memory 92 that is neither directly within the programmable fabric nor external to the programmable logic device. In other words, the embedded NOC 100 of the base die 24 provides the ability for data to be accessible to the sector-aligned memory 92 and to different sectors 48 of the fabric die 22.

In some embodiments, since the sector-aligned memory 92 may be located on a separate die from the fabric 22, the sector-aligned memory 92 may have a much larger capacity than a capacity of local in-fabric memory. Indeed, in some cases, the sector-aligned memory 92 may have a capacity of one-thousand times or greater than the capacity of local in-fabric memory.

The sector-aligned memory 92 may not only have a higher capacity than local in-fabric memory, but the sector-aligned memory 92 may also have a higher bandwidth than an external memory device. The high bandwidth may be made possible by physically locating the sector-aligned memory 92 near to the fabric die 22 (e.g., in the base die v24 vertically aligned with the fabric die 22) and/or by physically or logically dividing the sector-aligned memory 92 into separate sectors 90 that may transfer data in parallel to corresponding different sectors of the programmable logic fabric. This may also allow the sector-aligned memory 92 to be secured from access by other sectors 48 of the fabric die 22. Furthermore, depending on the physical arrangement of the fabric die 22 that contains the programmable logic sectors 48 and the base die 24 that contains the sector-aligned memory 92, the sector-aligned memory 92 may be pipelined into the programmable logic sectors 48, allowing for even faster data utilization.

Figure 10:
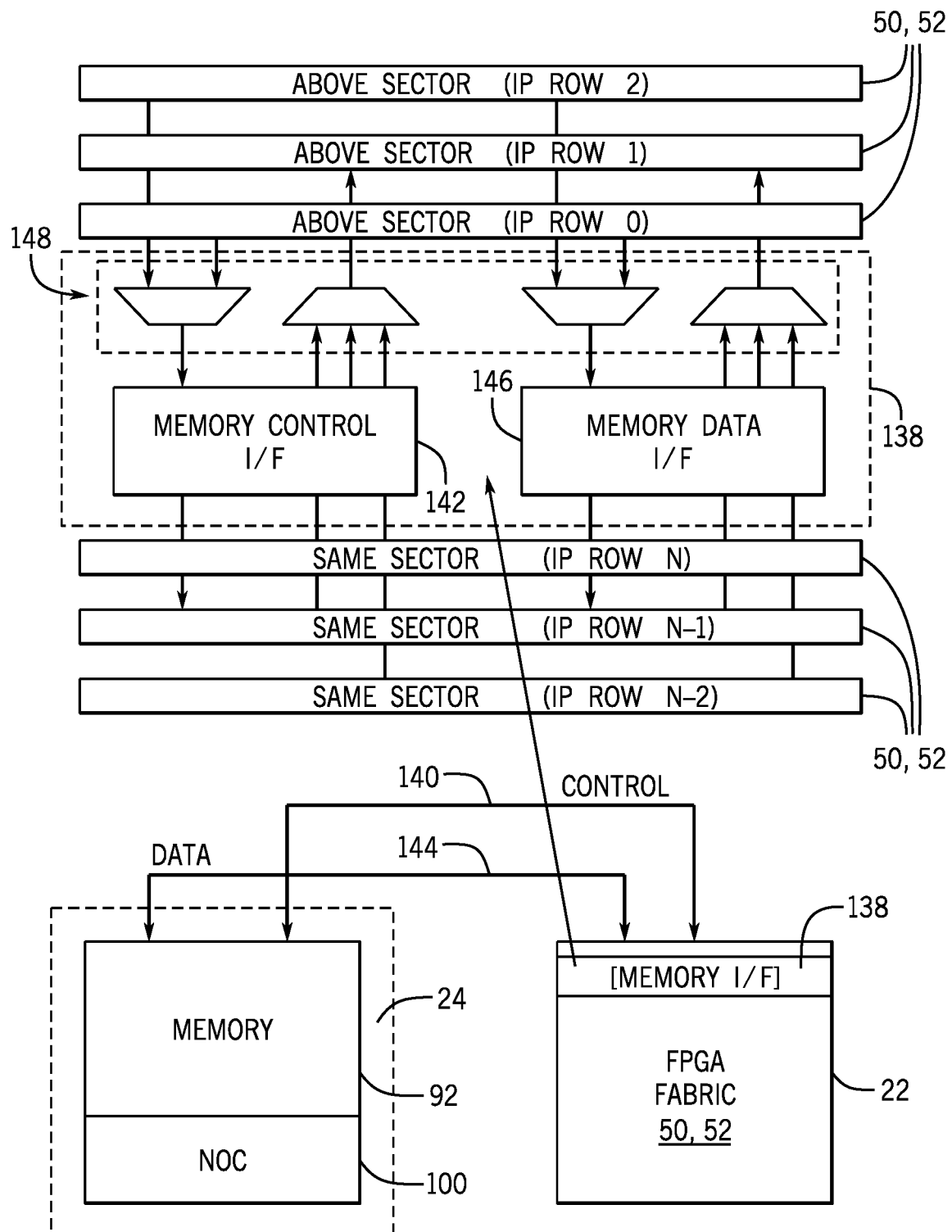
FIG. 10 is a block diagram of an interface of the fabric die to interface with the sector-aligned memory and the embedded NOC circuitry of the base die, in accordance with an embodiment.

With this in mind, FIG. 10 illustrates one embodiments in which the sector-aligned memory 92 is made accessible to the fabric die 22 via the NOC 100. Referring now to FIG. 10, the sector-aligned memory 92 of the base die 24 may be accessible by the programmable logic fabric (e.g., programmable logic elements 50 and associated configuration memory 52) of the fabric die 22 via a memory interface (I/F) 138. There may be one or more memory interfaces (I/F) 138 for each fabric sector, allowing different fabric sectors to access their respective sectors of the sector-aligned memory 92 in parallel. The memory interface (I/F) 138 may occupy a row of a fabric sector 80 and may be made of hardened logic or soft logic, or both. In the example of FIG. 10, the memory interface (I/F) 138 may occupy an outermost row of a fabric sector 80. This may allow the memory interface (I/F) 138 to facilitate communication not just with rows of programmable logic elements 50 and associated configuration memory 52 in the fabric sector 80 where the memory interface (I/F) 138 is located, but also with rows of programmable logic elements 50 and associated configuration memory 52 in an adjacent fabric sector 80.

The memory interface (I/F) 138 may receive or transmit data via a data path 140 to a memory data interface (I/F) 142 and may communicate control signals via a control signal path 144 to and from a memory control interface (I/F) 146. The memory interface (I/F) 138 may receive control and/or data signals and route them through the rows of programmable logic elements 50 and associated configuration memory 52 to a particular memory address or logic element via routing circuitry 148. The control signal path 144 and the data path 140 may represent a first physical connection between a first sector of programmable logic fabric and a first sector of the sector-aligned memory 92. It should be understood that similar pathways may represent a second physical connection between a second sector of programmable logic fabric and a second sector of the sector-aligned memory 92.

Regardless of its exact placement, the sector-aligned memory 92 may be located near enough to a particular area of the programmable logic fabric of the programmable logic device 12 to be able to provide very rapid data transfers. This may enable the sector-aligned memory 92 to be used for caching of data and/or configuration programs that may be programmed into the programmable logic fabric. One example of circuitry 132 that may use the sector-aligned memory 92 appears in FIG. 11. The various components shown in FIG. 11 may be located in a single die or may be distributed through several die (e.g., distributed through the fabric die 22 or the base die 24). Indeed, when programmable logic device 12 includes the fabric die 22 and the base die 24, each element of circuitry 132 represented by the block diagram of FIG. 11 may be found in at least one of the fabric die 22 and the base die 24, as desired. In many situations, however, the sector-aligned memory 92 may have a sufficiently high capacity that it may not fit in the fabric die 22, and thus may be located in the base die 24.

Figure 11:
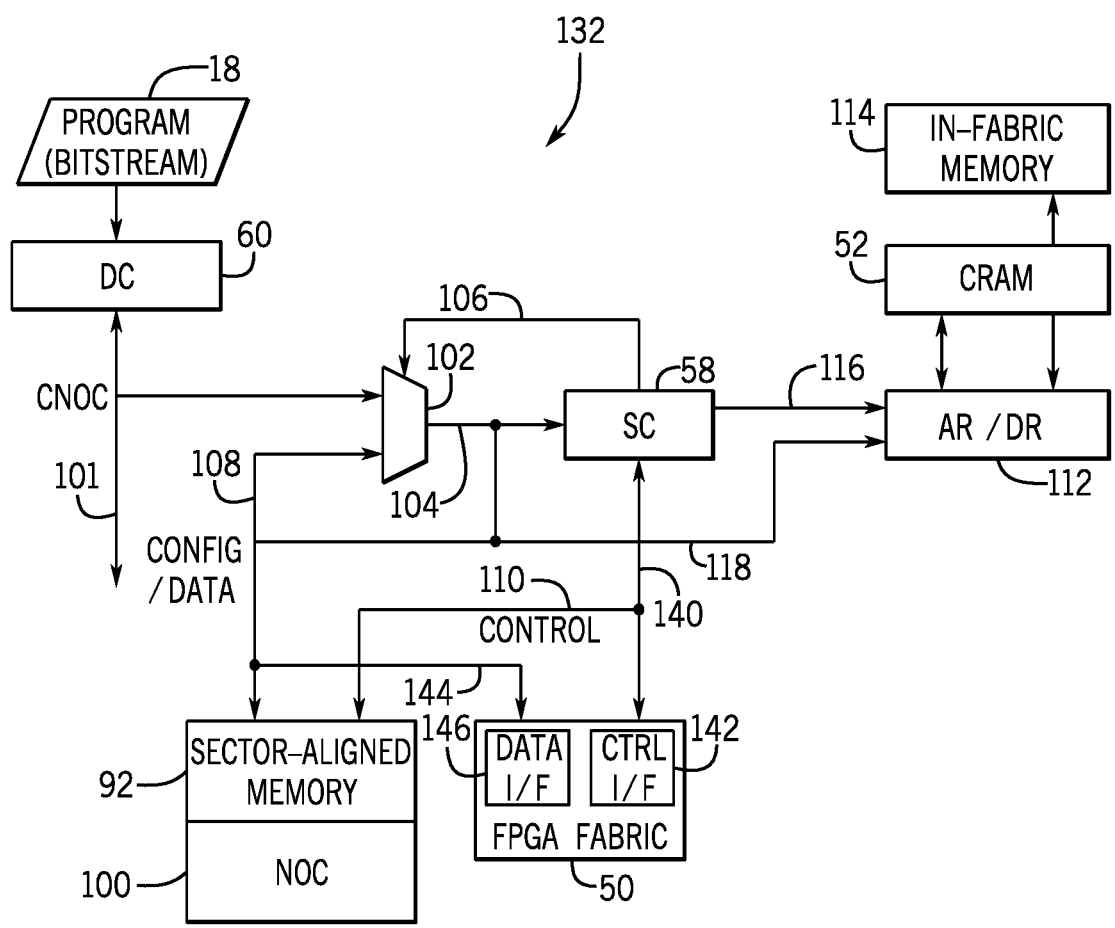
FIG. 11 is a block diagram of circuitry that may facilitate access to the embedded NOC circuitry of the base die by the programmable logic fabric using a sector controller, in accordance with an embodiment.

The circuitry 132 shown in FIG. 11 includes the device controller (DC) 60 that may receive, among other things, a bitstream 18. The bitstream 18 may represent data that may be received by the device controller (DC) 60, such as configuration data that may program the configuration memory (CRAM) 52 of a particular sector of programmable logic elements (FPGA fabric) 50 and/or data that may be processed by the programmable logic fabric (e.g., in a request to accelerate a compute task). The device controller 60 may receive the bitstream 18 from an external data source, such as an external data storage device or external memory device and may direct the bitstream 18 to the sector controller (SC) 58 of the particular sector via a configuration network on chip (CNOC) 100 or any other suitable pathway.

When the circuitry 132 of FIG. 11 is used for configuring the programmable logic device elements 50 by programming the configuration memory (CRAM) 52, routing circuitry 102 (e.g., a multiplexer) may provide the bitstream 18 to the sector controller (SC) 58 via a main signal path 104. When directed by the bitstream 18, when determined by a routine running on the sector controller (SC) 58, and/or when directed by the circuit design programmed into the programmable logic elements 50, the sector controller (SC) 58 may issue a selection signal over a selection pathway 106 to direct the routing circuitry 102 to receive the bitstream 18 from the CNOC 101 or to receive data from the sector-aligned memory 92, and/or whether to cache the bitstream 18 into the sector-aligned memory 92. Based on the selection signal on the selection pathway 106, the routing circuitry 102 may provide either data on the CNOC 101 or on a data pathway 108 from the sector-aligned memory 92 to the sector controller (SC) 58. A control pathway 110 may enable control communication between the sector controller (SC) 58 and the sector-aligned memory 92. The sector controller (SC) 58 may use the control pathway 110 to cause the sector-aligned memory 92 to retrieve data from or store data into the sector-aligned memory 92.

A configuration program 20 implemented in the programmable logic fabric, as defined by the configuration of programmable logic elements 50 programmed by the configuration memory (CRAM) 52, may utilize the sector-aligned memory 92. The configuration program 20 programmed into the programmable logic elements 50 may do so in several ways. In one example, the configuration program 20 may directly access (e.g., read from or write to) the sector-aligned memory via the control pathway 140 coupled to the control interface (CTRL I/F) 142 and the data pathway 144 coupled to the data interface (DATA I/F) 146 for direct data transfers between the programmable logic fabric and the sector-aligned memory 92. The configuration program 20 may include a memory controller for the sector-aligned memory 92 implemented in the programmable logic elements 50, which may be referred to as a memory controller implemented in soft logic, or a hardened memory controller may be accessible to the control interface (CTRL I/F) 142 and the data interface (DATA I/F) 146. In another example, the configuration program 20 may communicate control signals to the sector controller (SC) 58 via the control pathway 140 instructing the sector controller (SC) 58 to coordinate a data transfer to or from the sector-aligned memory 92. The configuration program 20 thus may include a soft processor or soft state machine to communicate with the sector controller (SC) 58 in this way, or hardened control circuitry may be disposed among the programmable logic elements 50 to communicate with the sector controller (SC) 58.

A memory address register/data register (AR/DR) 112 may program the configuration memory (CRAM) 52 and/or in-fabric memory 114 based on instructions from the sector controller (SC) 58 on a control pathway 116 and using data received on a data pathway 118. In this way, the AR/DR 112 may rapidly program the CRAM 52 and/or in-fabric memory 114 with data, such as data from the bitstream 18 received on the CNOC 101 or directly from sector-aligned memory 92 when so instructed. This may take place much more quickly than the time involved in receiving the entire bitstream 18 via the CNOC 101, which may face latencies due to accessing a memory device external to the programmable logic device 12. In some cases, this may be 50% faster, twice as fast, 5× as fast, 10× as fast, 20× as fast, 50× as fast, 100× as fast, 200× as fast, 500× as fast, 1000× as fast, or faster, to program the CRAM 52 and/or in-fabric memory 114 with data directly from the sector-aligned memory 92 than to program the CRAM 52 and/or in-fabric memory 114 with the bitstream 18 from the CNOC 101. Here, it may also be noted that the amount of memory available in the in-fabric memory 114 may be much smaller than the amount of memory available in the sector-aligned memory 92. In fact, the sector-aligned memory 92 may have a capacity many times that of the in-fabric memory 114 (e.g., 10×, 100×, 1000×, or more).

Figure 12:
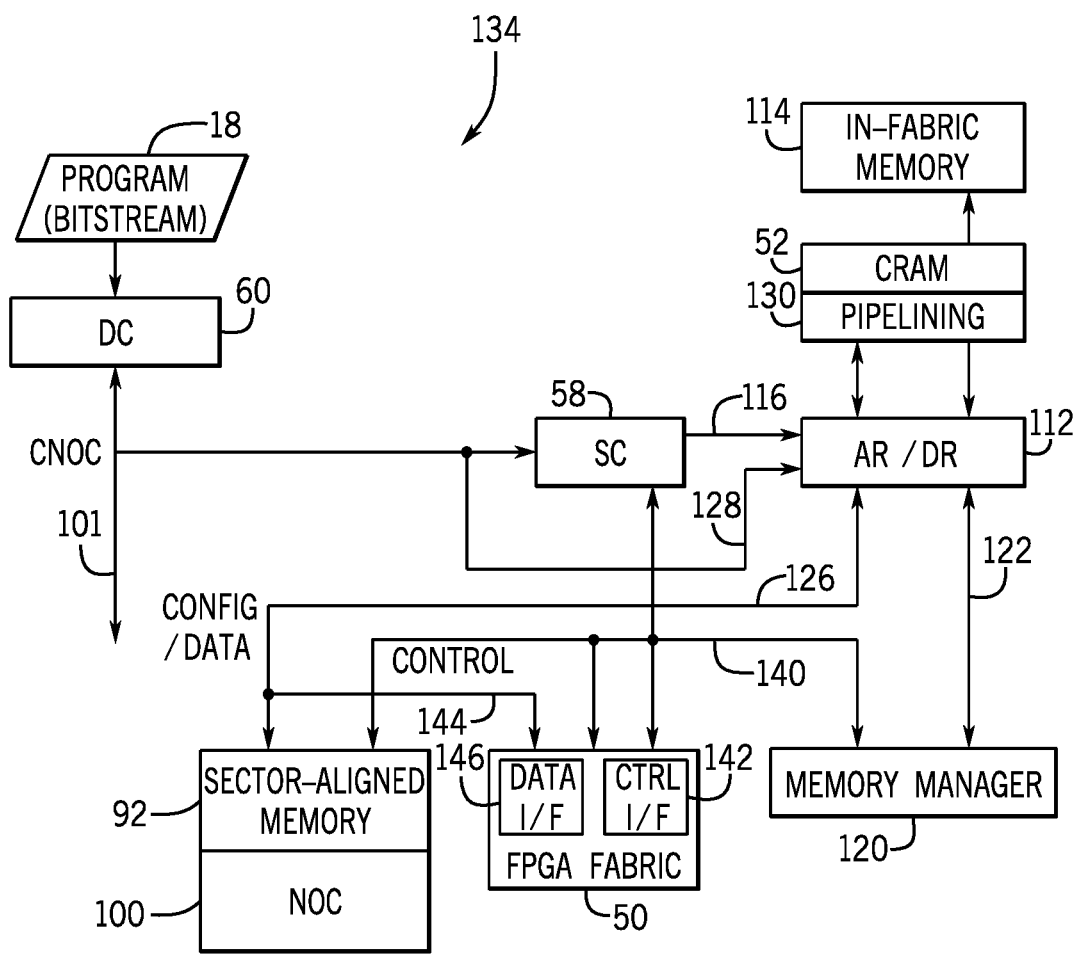
FIG. 12 is a block diagram of circuitry that may facilitate access to the embedded NOC circuitry of the base die using a sector controller and a memory manager for pipelining, in accordance with an embodiment.

For even faster programming, the programming of the CRAM 52 and/or in-fabric memory 114 may be pipelined, as shown in FIG. 12. A memory manager 120 may coordinate control of the AR/DR 112 via control pathways 122 and 124. The memory manager 120 may be located in the fabric die 22 and/or in the base die 24. The memory manager 120 may be implemented as a state machine and/or as a processor running software or firmware and may control the data transfers to and/or from the sector-aligned memory 92 and the AR/DR 112 over a data pathway 126. The data pathway 126 may communicate data more rapidly than may be provided over the CNOC 101. The data pathway 126 may have a faster frequency and/or may carry data more widely, in parallel, than the CNOC 101.

The sector controller (SC) 58 may coordinate with the AR/DR 112 and the memory manager 120 to receive the bitstream 18 via a data pathway 128 from the CNOC 101 or from the sector-aligned memory 92. As mentioned above, the sector controller (SC) 58 may control whether to receive data of the bitstream 18 from the CNOC 101 or to get it from the sector-aligned memory 92, and/or whether to cache or pre-cache (e.g., in a cache prefetch) the bitstream 18 into the sector-aligned memory 92.

As with the circuitry 132 of FIG. 11, in the circuitry 134 of FIG. 12, a configuration program 20 implemented in the programmable logic fabric, as defined by the configuration of programmable logic elements 50 programmed by the configuration memory (CRAM) 52, may utilize the sector-aligned memory 92. The configuration program 20 programmed into the programmable logic elements 50 may do so in several ways. In one example, the configuration program 20 may directly access (e.g., read from or write to) the sector-aligned memory via the control pathway 140 coupled to the control interface (CTRL I/F) 142 and the data pathway 144 coupled to the data interface (DATA I/F) 146 for direct data transfers between the programmable logic fabric and the sector-aligned memory 92. The configuration program 20 may include a memory controller for the sector-aligned memory 92 implemented in the programmable logic elements 50, which may be referred to as a memory controller implemented in soft logic, or a hardened memory controller may be accessible to the control interface (CTRL I/F) 142 and the data interface (DATA I/F) 146. In another example, the configuration program 20 may communicate control signals to the sector controller (SC) 58 and/or the memory manager 120 via the control pathway 140. The configuration program 20 may instruct the sector controller (SC) 58 and/or the memory manager 120 to coordinate a data transfer to or from the sector-aligned memory 92. The configuration program 20 thus may include a soft processor or soft state machine to communicate with the sector controller (SC) 58 in this way, or hardened control circuitry may be disposed among the programmable logic elements 50 to communicate with the sector controller (SC) 58 and/or the memory manager 120.

Data from the CNOC 101 or the sector-aligned memory 92 may be loaded into the AR/DR 112 and pipelined into the CRAM 52 and/or in-fabric memory 114 via pipelining circuitry 130. The pipelining circuitry 130 may allow multiple cells of the configuration memory (CRAM) 52 to be programmed at once by pipelining multiple bits of data into registers of the AR/DR 112 before the AR/DR 112 programs multiple cells of the configuration memory (CRAM) 52 at once (e.g., instead of programming the configuration memory (CRAM) 52 one cell at a time). This may allow large quantities of data from the sector-aligned memory 92 to rapidly enter the CRAM 52 cells or the in-fabric memory 114. As noted above, this may take place much more quickly than the time involved in receiving the entire bitstream 18 via the CNOC 101. In some cases, it may be 50% faster, twice as fast, 5× as fast, 10× as fast, 20× as fast, 50× as fast, 100× as fast, 200× as fast, 500× as fast, 1000× as fast, or faster, to program the CRAM 52 and/or in-fabric memory 114 with bitstream 18 directly from sector-aligned memory 92 than to program the CRAM 52 and/or in-fabric memory 114 with the bitstream 18 from the CNOC 101.

In addition to transferring data to or from the sector-aligned memory 92, the circuitry 132 and the circuitry 134 depicted in FIGS. 9 and 10 may also be employed to all the FPGA fabric 50 to communicate directly with the NOC 100, which may be embedded in the sector-aligned memory 92. That is, the same interface used to communicate configuration and user data in the circuitry 132 of FIG. 11 may be used to enable direct communication between the FPGA fabric 50 and the NOC 100. In another embodiment, the sector controller (SC) 58 of the circuitry 132 in FIG. 11 may coordinate the communication of data between the FPGA fabric 50 and the NOC 100. In the same manner, the circuitry 134 of FIG. 12 may be employed to allow the FPGA fabric 50 to communicate directly with the NOC 100 over the same interface used for transferring configuration data, as described above, using a direct FPGA fabric 50 to sector-aligned memory 92/NOC 100 connection or using a coordinated effort between the sector controller (SC) 58 and or the memory manager 120.

Figure 13:
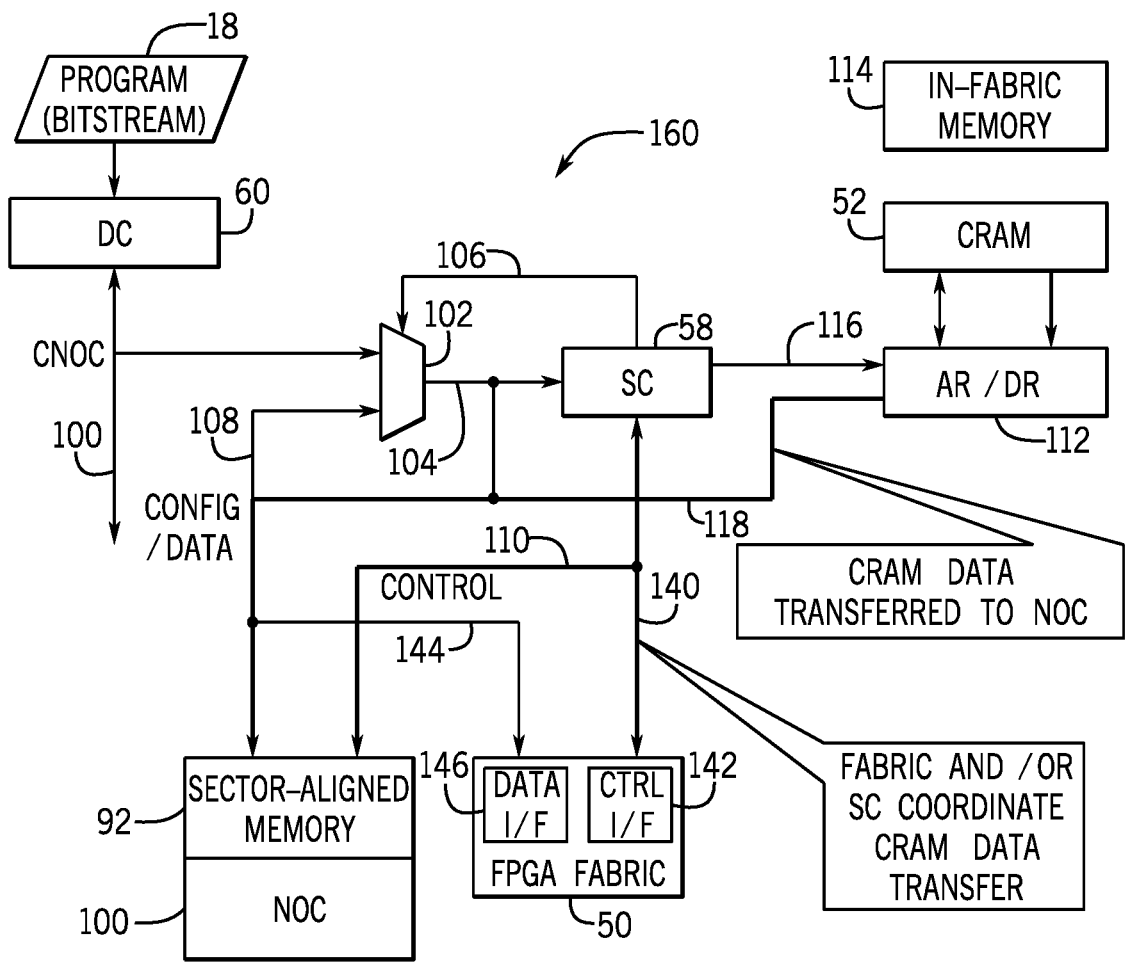
FIG. 13 is a block diagram illustrating an example of transferring data from configuration memory to the embedded NOC circuitry by a sector controller using the circuitry of FIG. 11, in accordance with an embodiment.
Figure 14:
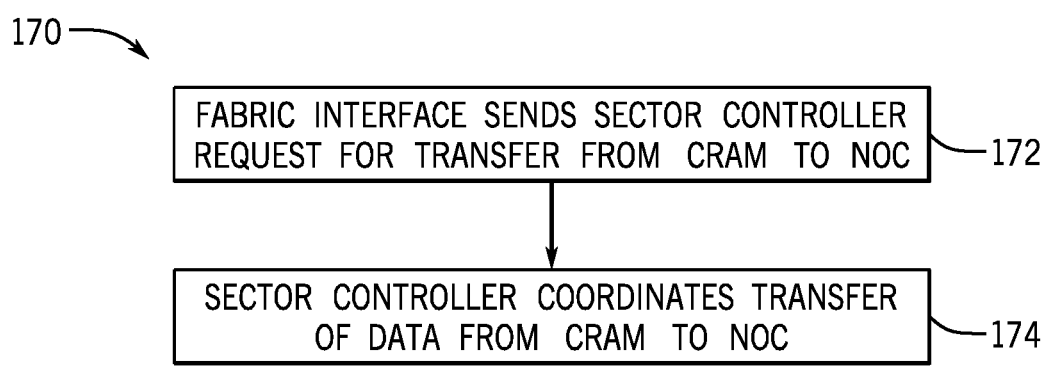
FIG. 14 is a flowchart of a method for transferring data from configuration memory to the embedded NOC circuitry by a sector controller of the programmable logic fabric using the circuitry of FIG. 11, in accordance with an embodiment.

With the foregoing in mind, FIG. 12 illustrates a communication scheme 160 that may be employed by the circuitry 132 of FIG. 11 to communicate data from the CRAM 52 to the NOC 100, in accordance with embodiments presented herein. In addition, FIG. 14 illustrates a flow chart of a method 170 for transferring data from the CRAM 52 to the NOC 100 using the communication scheme 160 of FIG. 13.

Keeping both of these figures in mind, in one embodiment, at block 172, the control interface (CTRL I/F) 142 may issue a control signal on the control pathway 140 to the sector controller (SC) 58. The control signal may include a request for a data transfer from the CRAM 52 to the NOC 100. In one embodiment, the request may include an address range specified by the FPGA fabric 50. After receiving the request for the data transfer from the CRAM 52 to the NOC 100, at block 174, the sector controller (SC) 58 may cause desired contents of the CRAM 52 at the specified address range to be transferred to the NOC 100 via the data register 112 and the data pathway 118.

Figure 15:
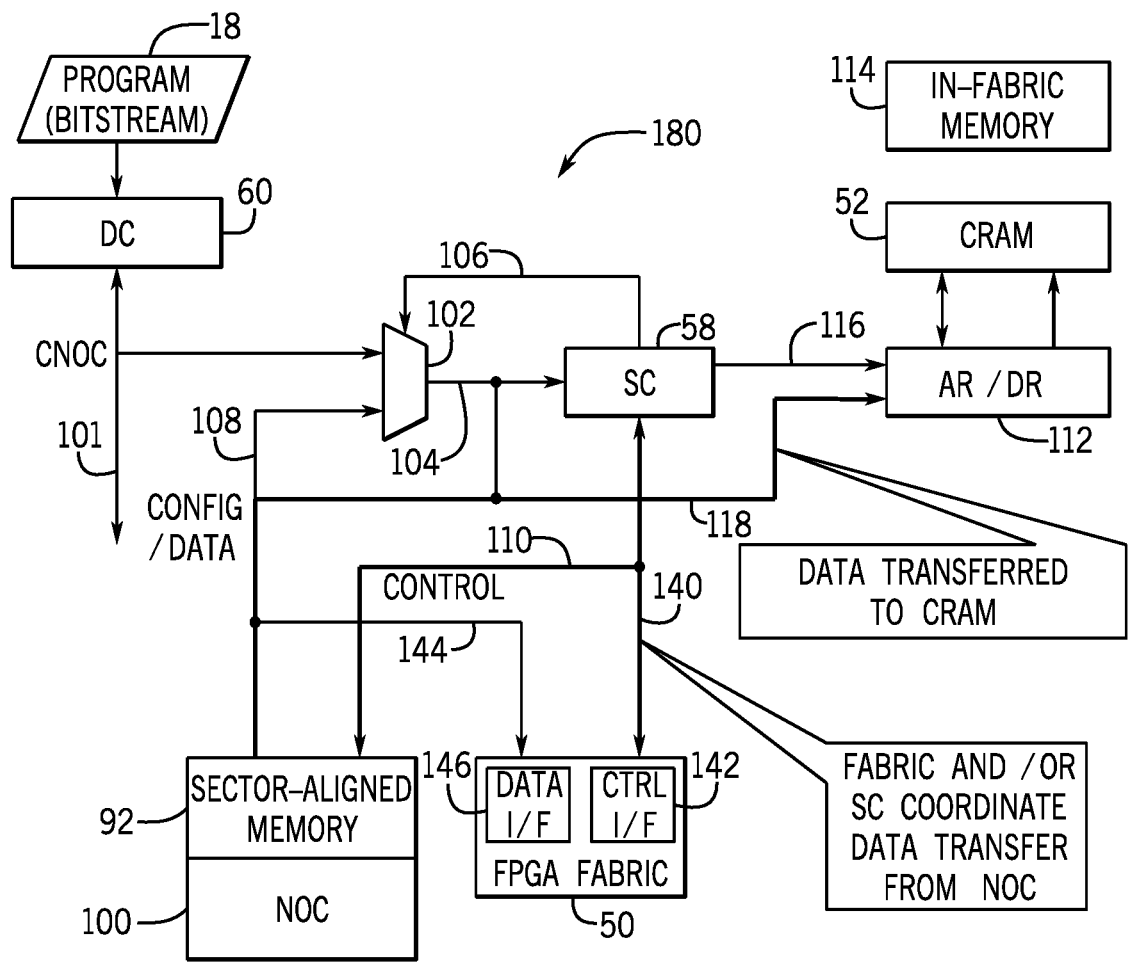
FIG. 15 is a block diagram illustrating an example of transferring data from the embedded NOC circuitry to the configuration memory by a sector controller using the circuitry of FIG. 11, in accordance with an embodiment.

In addition to directing the data transfer from the CRAM 52 to the NOC 100, the circuit 132 may be employed to transfer data from the NOC 100 to the CRAM 52 in accordance with the communication scheme 180 depicted in FIG. 15. By way of example, FIG. 16 illustrates a flow chart of a method 190 for transferring data from the NOC 100 to the CRAM 52 using the communication scheme 180.

Figure 16:
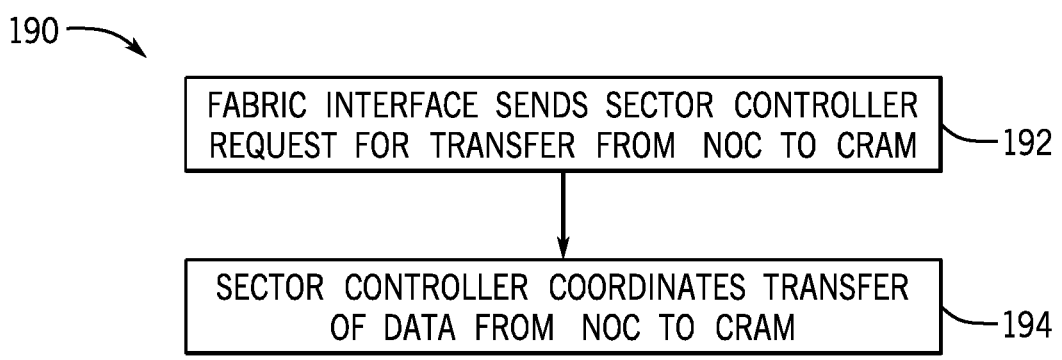
FIG. 16 is a flowchart of a method for transferring data from the embedded NOC circuitry to the configuration memory by a sector controller of the programmable logic fabric using the circuitry of FIG. 11, in accordance with an embodiment.

Referring now to FIG. 16, at block 192, the control interface (CTRL I/F) 142 may issue a control signal on the control pathway 140 to the sector controller (SC) 58 for a data transfer from the NOC 100 to the CRAM 52. After receiving the request for the data transfer from the CRAM 52 to the NOC 100, at block 194, the sector controller (SC) 58 may cause desired contents of the NOC 100 to be transferred to the CRAM 52 via the data pathway 118.

Figure 17:
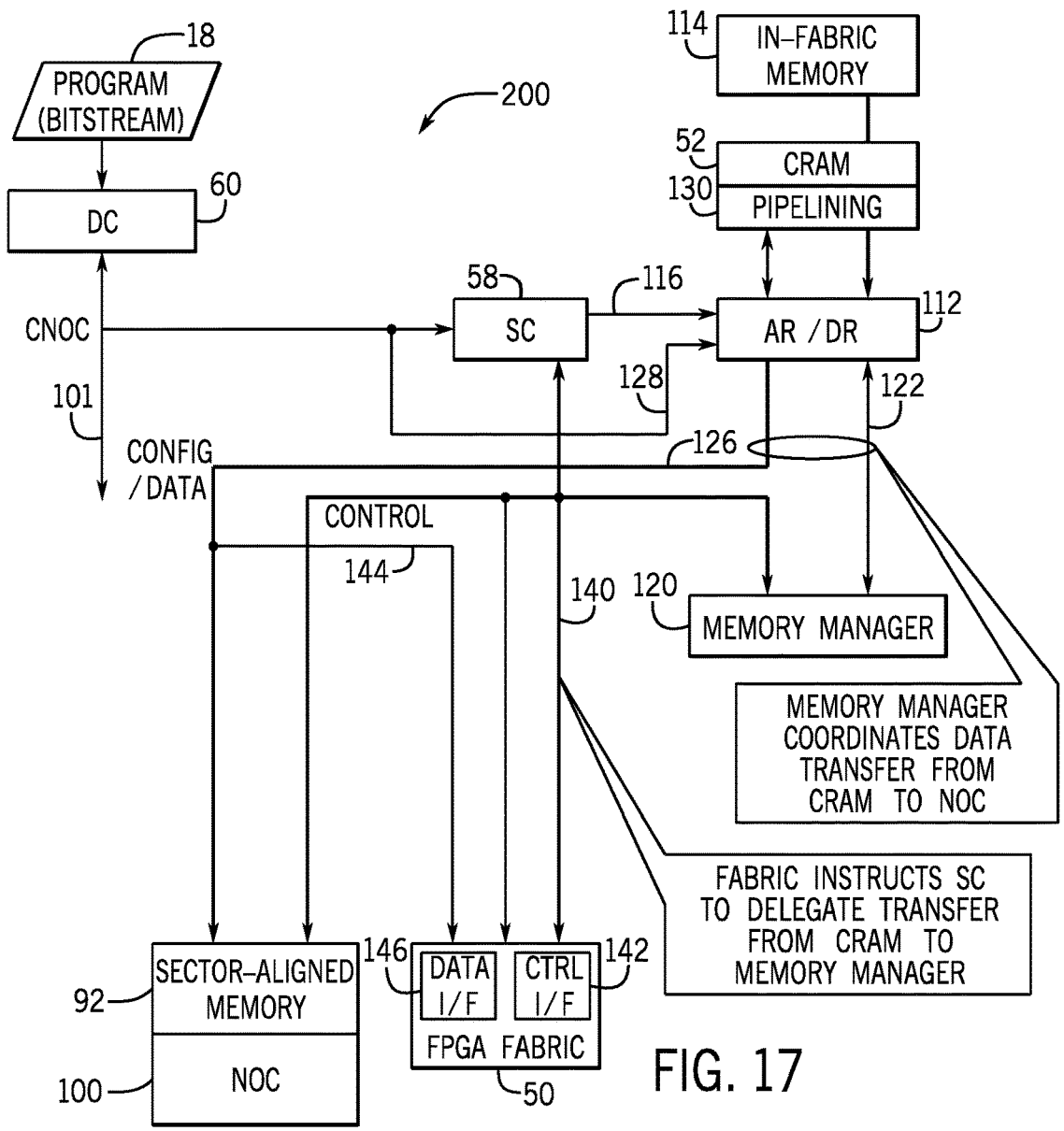
FIG. 17 is a block diagram illustrating an example of transferring data from configuration memory to the embedded NOC circuitry by a sector controller using the circuitry of FIG. 12, in accordance with an embodiment.
Figure 18:
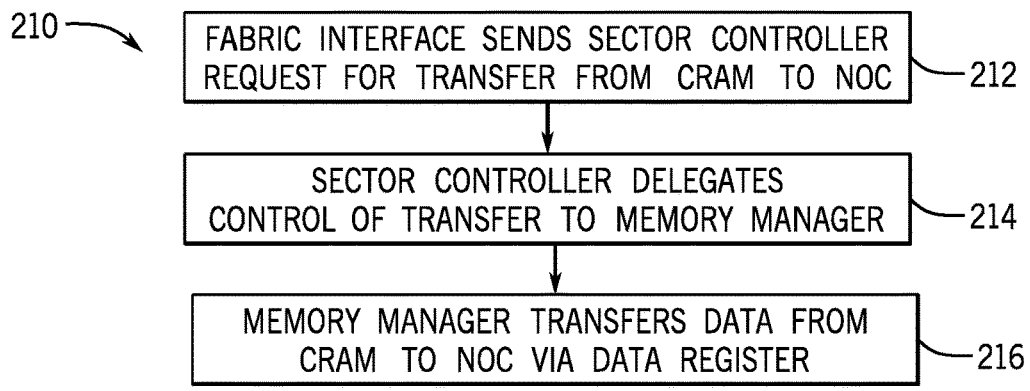
FIG. 18 is a flowchart of a method for transferring data from configuration memory to the embedded NOC circuitry by a sector controller of the programmable logic fabric using the circuitry of FIG. 12, in accordance with an embodiment.

As discussed above, the FPGA fabric 50 may also communicate directly with the NOC 100 using the circuitry 134 of FIG. 12. As such, in some embodiments, the sector controller (SC) 58 may coordinate the transfer of data between the FPGA fabric 50 and the NOC 100 by delegating the transfer to the memory manager 120. With this in mind, FIG. 17 illustrates a communication scheme 120 that may be employed by the circuitry 134 of FIG. 12 to communicate data from the CRAM 52 to the NOC 100, in accordance with embodiments presented herein. In addition, FIG. 18 illustrates a flow chart of a method 210 for transferring data from the CRAM 52 to the NOC 100 using the communication scheme 200 of FIG. 17.

Keeping both of these figures in mind, in one embodiment, at block 212, the control interface (CTRL I/F) 142 may issue a control signal on the control pathway 140 to the sector controller (SC) 58. The control signal may include a request for a data transfer from the CRAM 52 to the NOC 100. In one embodiment, the request may include an address range specified by the FPGA fabric 50. After receiving the request for the data transfer from the CRAM 52 to the NOC 100, at block 214, the sector controller (SC) 58 may delegate the transfer request to the memory manager 120. That is, the sector controller (SC) 58 may relay the request to the memory manager 120. At block 216, the memory manager 120 may cause desired contents of the CRAM 52 at the specified address range to be transferred to the NOC 100 via the data register 112 and the data pathway 126, as shown in the communication scheme 200 of FIG. 17.

Figure 19:
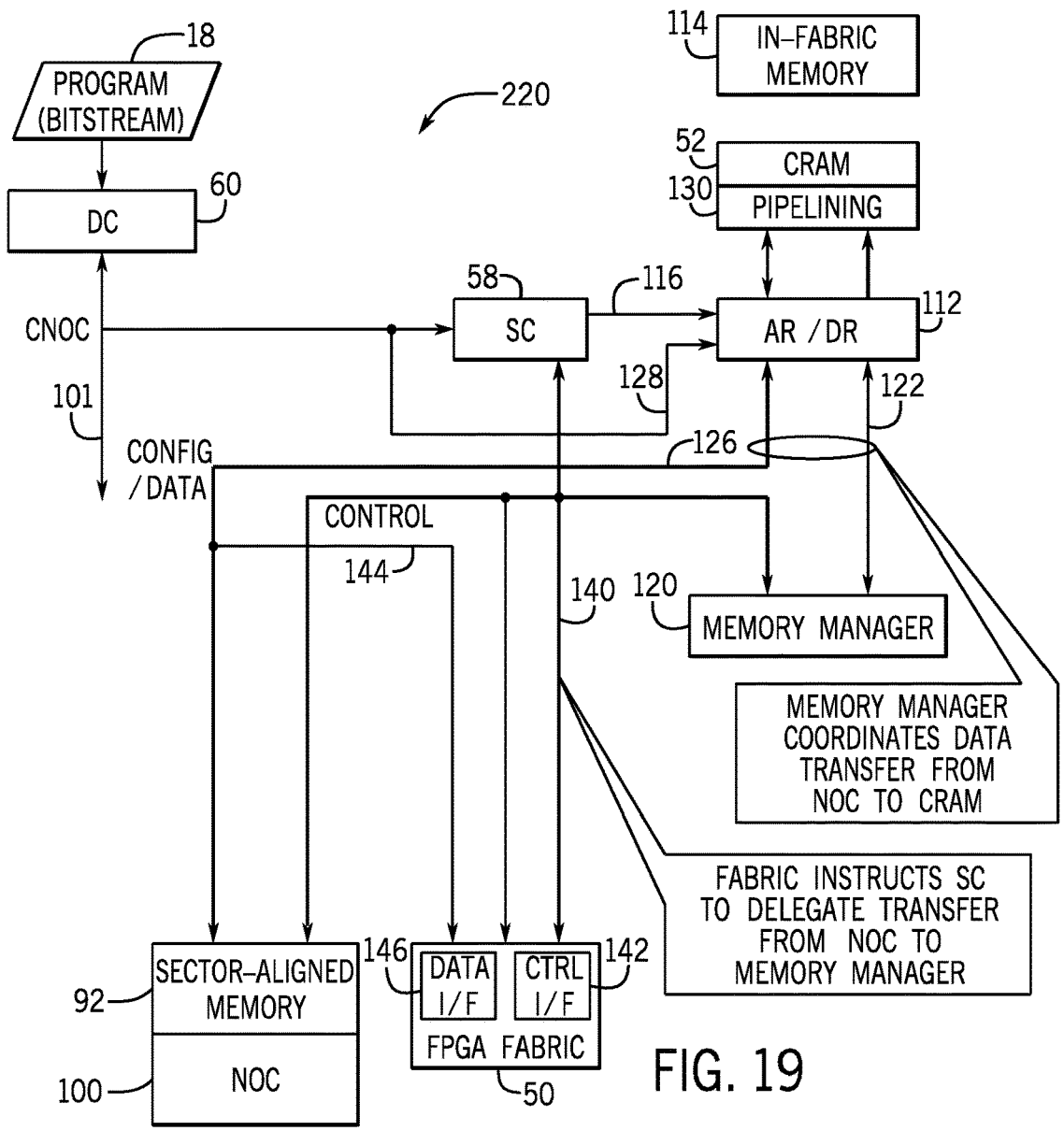
FIG. 19 is a block diagram illustrating an example of transferring data from the embedded NOC circuitry to the configuration memory by a sector controller using the circuitry of FIG. 12, in accordance with an embodiment.

In addition to directing the data transfer from the CRAM 52 to the NOC 100, the circuit 134 may be employed to transfer data from the NOC 100 to the CRAM 52 in accordance with the communication scheme 220 depicted in FIG. 19. By way of example, FIG. 20 illustrates a flow chart of a method 230 for transferring data from the NOC 100 to the CRAM 52 using the communication scheme 220.

Figure 20:
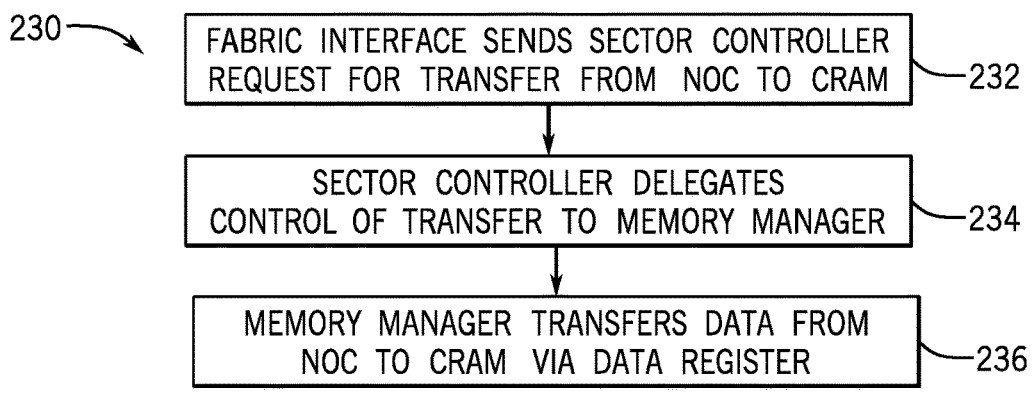
FIG. 20 is a flowchart of a method for transferring data from the embedded NOC circuitry to the configuration memory by a sector controller of the programmable logic fabric using the circuitry of FIG. 12, in accordance with an embodiment.

Referring now to FIG. 20, at block 232, the control interface (CTRL I/F) 142 may issue a control signal on the control pathway 140 to the sector controller (SC) 58. The control signal may include a request for a data transfer from the NOC 100 to the CRAM 52. After receiving the request for the data transfer from the NOC 100 to the CRAM 52, at block 234, the sector controller (SC) 58 may delegate the transfer request to the memory manager 120. That is, the sector controller (SC) 58 may relay the request to the memory manager 120. At block 236, the memory manager 120 may cause desired contents of the NOC 100 to be transferred to the CRAM 52 via the data register 112 and the data pathway 126, as shown in the communication scheme 230 of FIG. 19.

Figure 21:
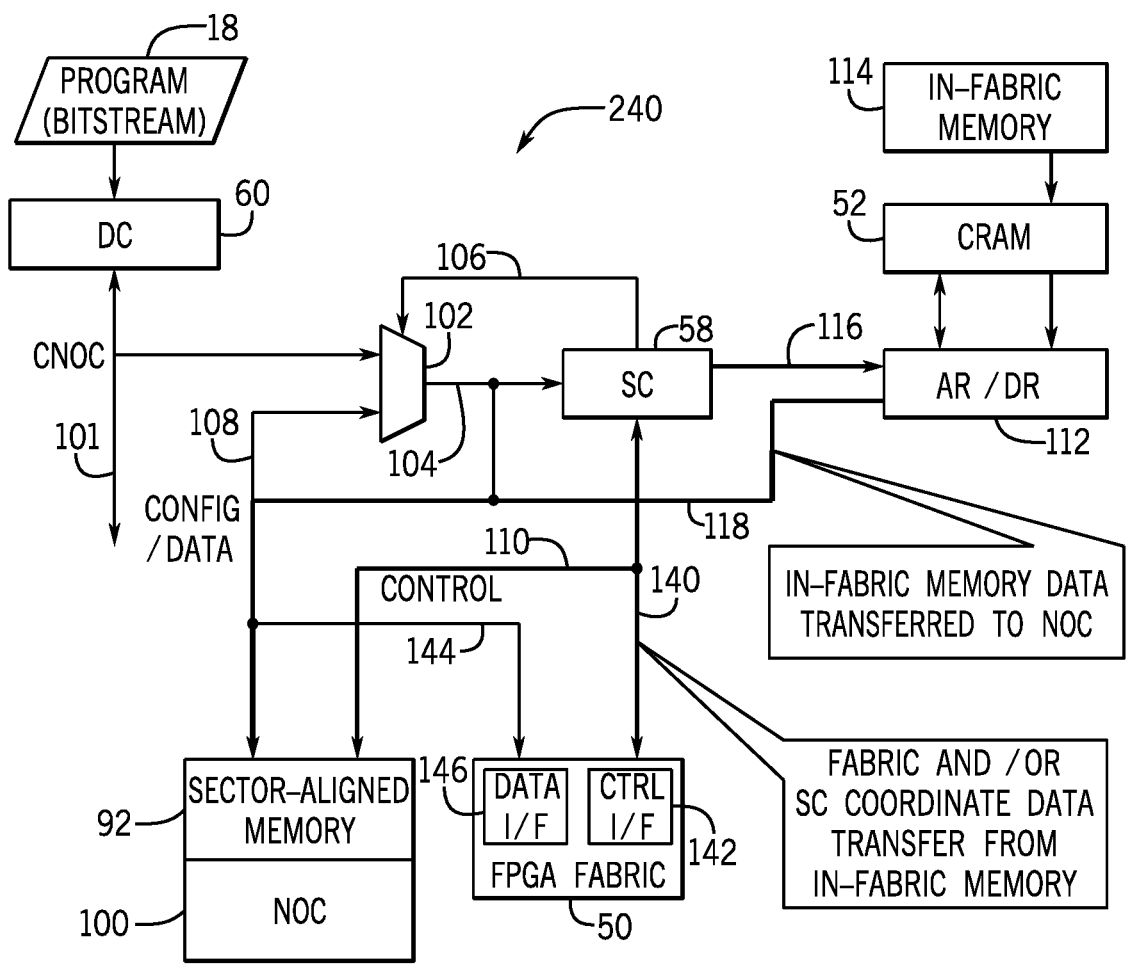
FIG. 21 is a block diagram illustrating an example of transferring data from in-fabric memory to the embedded NOC circuitry by a sector controller using the circuitry of FIG. 11, in accordance with an embodiment.

In addition to transferring data between the NOC 100 and the CRAM 52, the circuitry 132 and the circuitry 134 depicted in FIGS. 9 and 10 may also be employed to facilitate communication between the in-fabric memory 114 and the NOC 100. For example, FIG. 21 illustrates a communication scheme 240 that may be employed by the circuitry 132 of FIG. 11 to communicate data from the in-fabric memory 114 to the NOC 100, in accordance with embodiments presented herein. In addition, FIG. 22 illustrates a flow chart of a method 250 for transferring data from the in-fabric memory 114 to the NOC 100 using the communication scheme 240 of FIG. 21.

Figure 22:
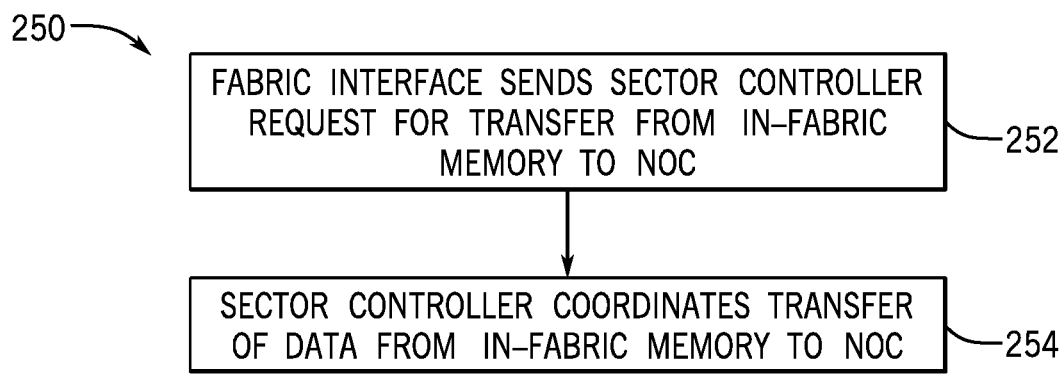
FIG. 22 is a flowchart of a method for transferring data from in-fabric memory to the embedded NOC circuitry by a sector controller of the programmable logic fabric using the circuitry of FIG. 11, in accordance with an embodiment.

Referring to FIG. 22, in one embodiment, at block 252, the control interface (CTRL I/F) 142 may issue a control signal on the control pathway 140 to the sector controller (SC) 58. The control signal may include a request for a data transfer from the in-fabric memory 114 to the NOC 100. In one embodiment, the request may include an address range specified by the FPGA fabric 50. After receiving the request for the data transfer from the in-fabric memory 114 to the NOC 100, at block 254, the sector controller (SC) 58 may cause desired contents of the in-fabric memory 114 at the specified address range to be transferred to the NOC 100 via the data register 112 and the data pathway 118.

Figure 23:
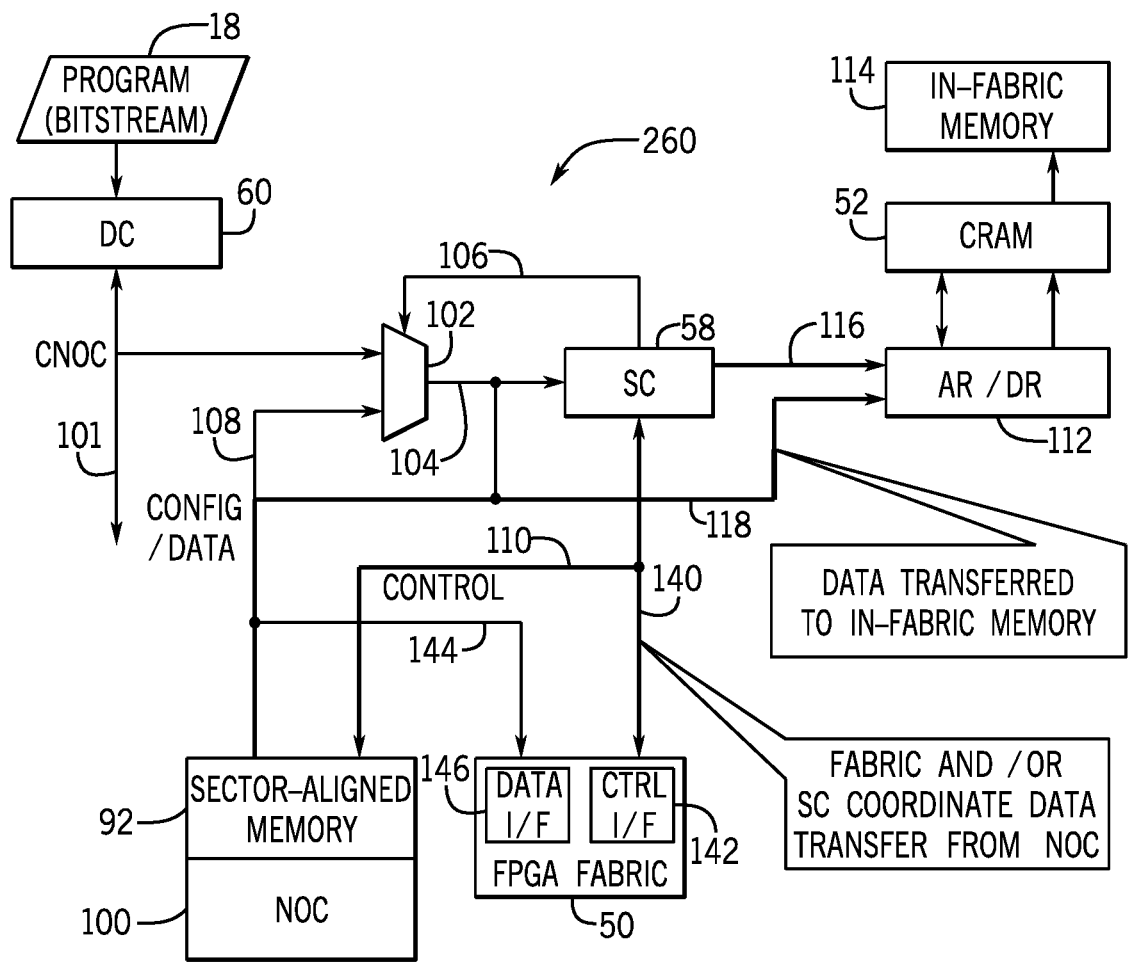
FIG. 23 is a block diagram illustrating an example of transferring data from the embedded NOC circuitry to the in-fabric memory by a sector controller using the circuitry of FIG. 11, in accordance with an embodiment.

In addition to directing the data transfer from the in-fabric memory 114 to the NOC 100, the circuit 132 may be employed to transfer data from the NOC 100 to the in-fabric memory 114 in accordance with the communication scheme 260 depicted in FIG. 23. By way of example, FIG. 24 illustrates a flow chart of a method 270 for transferring data from the NOC 100 to the in-fabric memory 114 using the communication scheme 260.

Figure 24:
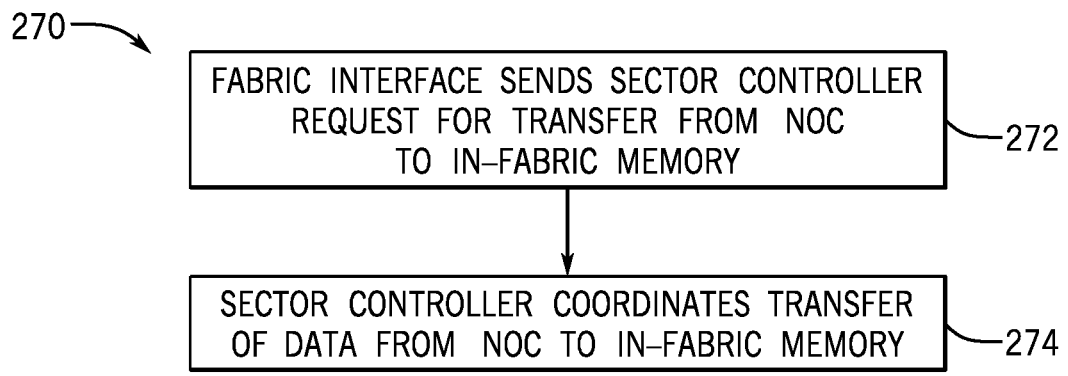
FIG. 24 is a flowchart of a method for transferring data from the embedded NOC circuitry to the in-fabric memory by a sector controller of the programmable logic fabric using the circuitry of FIG. 11, in accordance with an embodiment.

Referring now to FIG. 24, at block 272, the control interface (CTRL I/F) 142 may issue a control signal on the control pathway 140 to the sector controller (SC) 58 for a data transfer from the NOC 100 to the in-fabric memory 114. After receiving the request for the data transfer from the in-fabric memory 114 to the NOC 100, at block 274, the sector controller (SC) 58 may cause desired contents of the NOC 100 to be transferred to the in-fabric memory 114 via the data register 112 and the data pathway 118.

Figure 25:
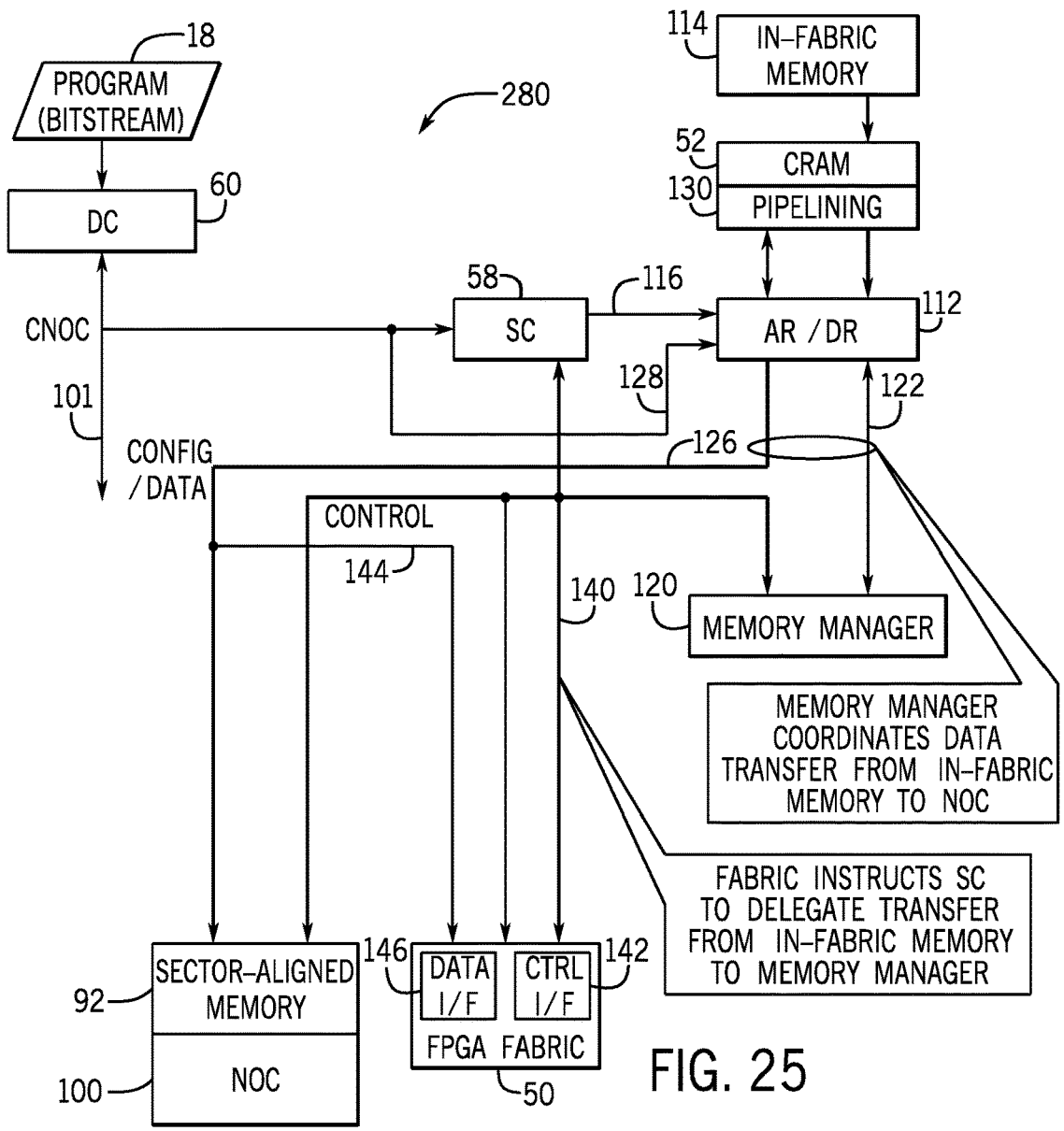
FIG. 25 is a block diagram illustrating an example of transferring data from in-fabric memory to the embedded NOC circuitry by a sector controller using the circuitry of FIG. 12, in accordance with an embodiment.
Figure 26:
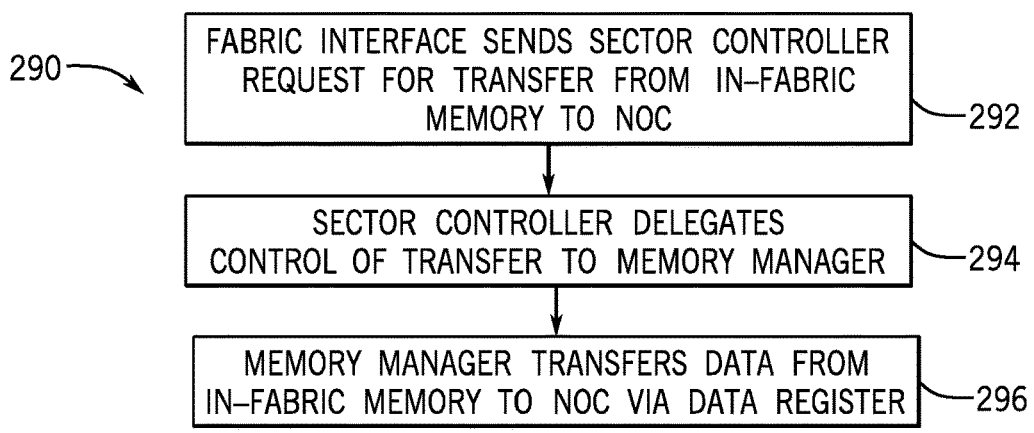
FIG. 26 is a flowchart of a method for transferring data from in-fabric memory to the embedded NOC circuitry by a sector controller of the programmable logic fabric using the circuitry of FIG. 12, in accordance with an embodiment.

In certain embodiments, the sector controller (SC) 58 may coordinate the transfer of data between the in-fabric memory 114 and the NOC 100 by delegating the transfer to the memory manager 120 using the circuitry 134 of FIG. 12. With this in mind, FIG. 25 illustrates a communication scheme 280 that may be employed by the circuitry 134 of FIG. 12 to communicate data from the in-fabric memory 114 to the NOC 100, in accordance with embodiments presented herein. In addition, FIG. 26 illustrates a flow chart of a method 290 for transferring data from the in-fabric memory 114 to the NOC 100 using the communication scheme 280 of FIG. 25.

Referring now to FIG. 25, in one embodiment, at block 292, the control interface (CTRL I/F) 142 may issue a control signal on the control pathway 140 to the sector controller (SC) 58. The control signal may include a request for a data transfer from the in-fabric memory 114 to the NOC 100. In one embodiment, the request may include an address range specified by the FPGA fabric 50. After receiving the request for the data transfer from the in-fabric memory 114 to the NOC 100, at block 294, the sector controller (SC) 58 may delegate the transfer request to the memory manager 120. That is, the sector controller (SC) 58 may relay the request to the memory manager 120. At block 296, the memory manager 120 may cause desired contents of the in-fabric memory 114 at the specified address range to be transferred to the NOC 100 via the data register 112 and the data pathway 126, as shown in the communication scheme 280 of FIG. 25.

Figure 27:
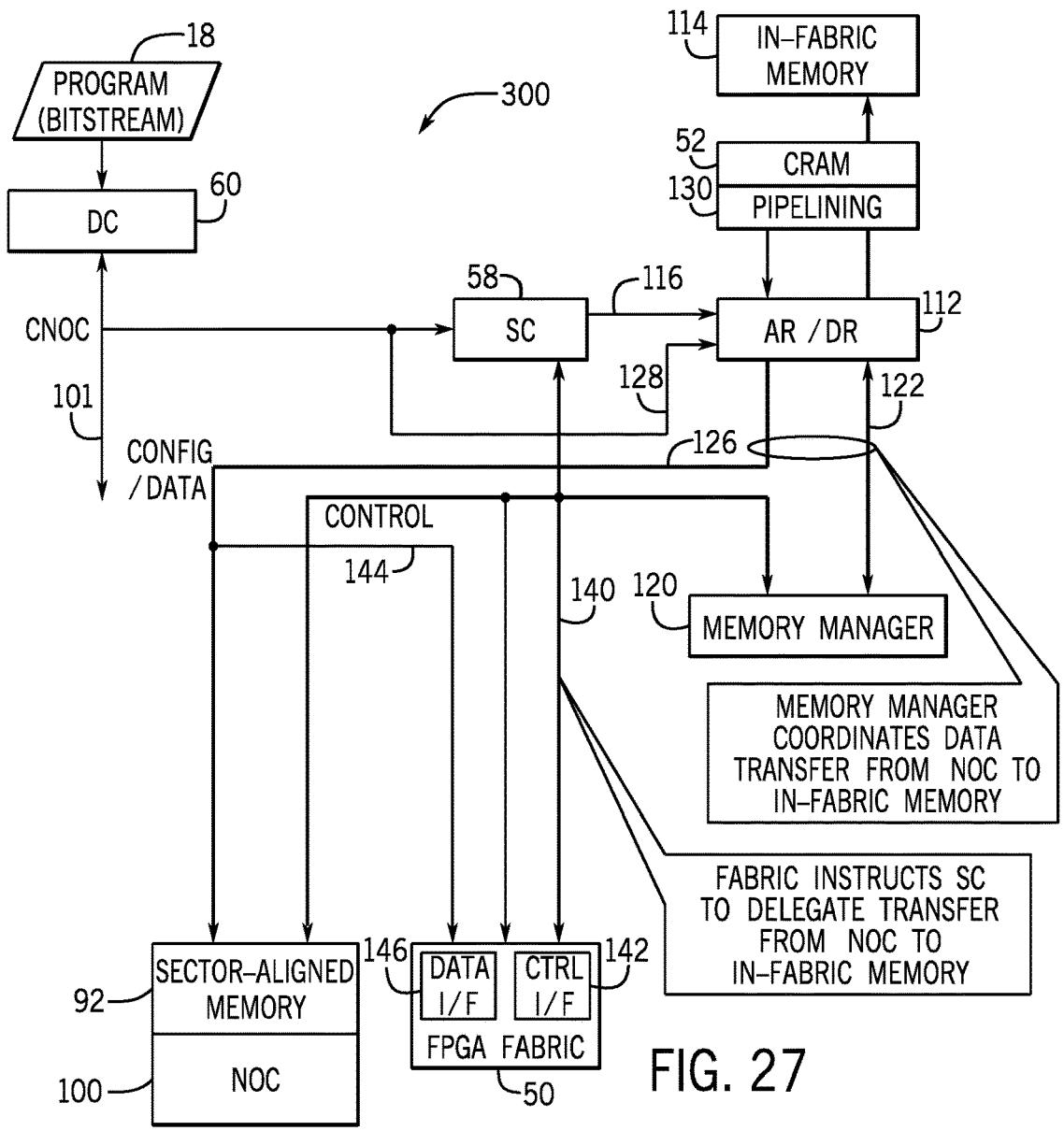
FIG. 27 is a block diagram illustrating an example of transferring data from the embedded NOC circuitry to the in-fabric memory by a sector controller using the circuitry of FIG. 12, in accordance with an embodiment.

In addition to directing the data transfer from the in-fabric memory 114 to the NOC 100, the circuit 134 may be employed to transfer data from the NOC 100 to the in-fabric memory 114 in accordance with the communication scheme 300 depicted in FIG. 27. By way of example, FIG. 28 illustrates a flow chart of a method 310 for transferring data from the NOC 100 to the in-fabric memory 114 using the communication scheme 300.

Figure 28:
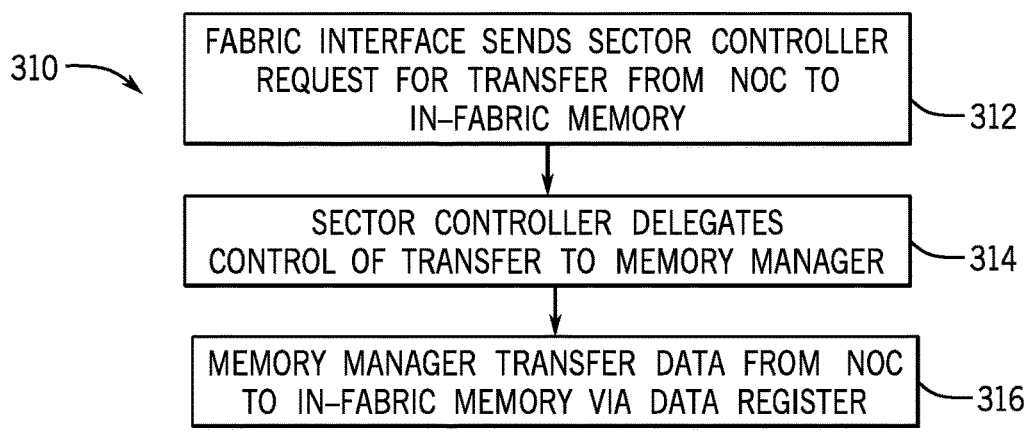
FIG. 28 is a flowchart of a method for transferring data from the embedded NOC circuitry to the in-fabric memory by a sector controller of the programmable logic fabric using the circuitry of FIG. 12, in accordance with an embodiment.

Referring now to FIG. 28, at block 312, the control interface (CTRL I/F) 142 may issue a control signal on the control pathway 140 to the sector controller (SC) 58. The control signal may include a request for a data transfer from the NOC 100 to the in-fabric memory 114. After receiving the request for the data transfer from the NOC 100 to the in-fabric memory 114, at block 314, the sector controller (SC) 58 may delegate the transfer request to the memory manager 120. That is, the sector controller (SC) 58 may relay the request to the memory manager 120. At block 316, the memory manager 120 may cause desired contents of the NOC 100 to be transferred to the in-fabric memory 114 via the data register 112 and the data pathway 126, as shown in the communication scheme 300 of FIG. 27.

Figure 29:
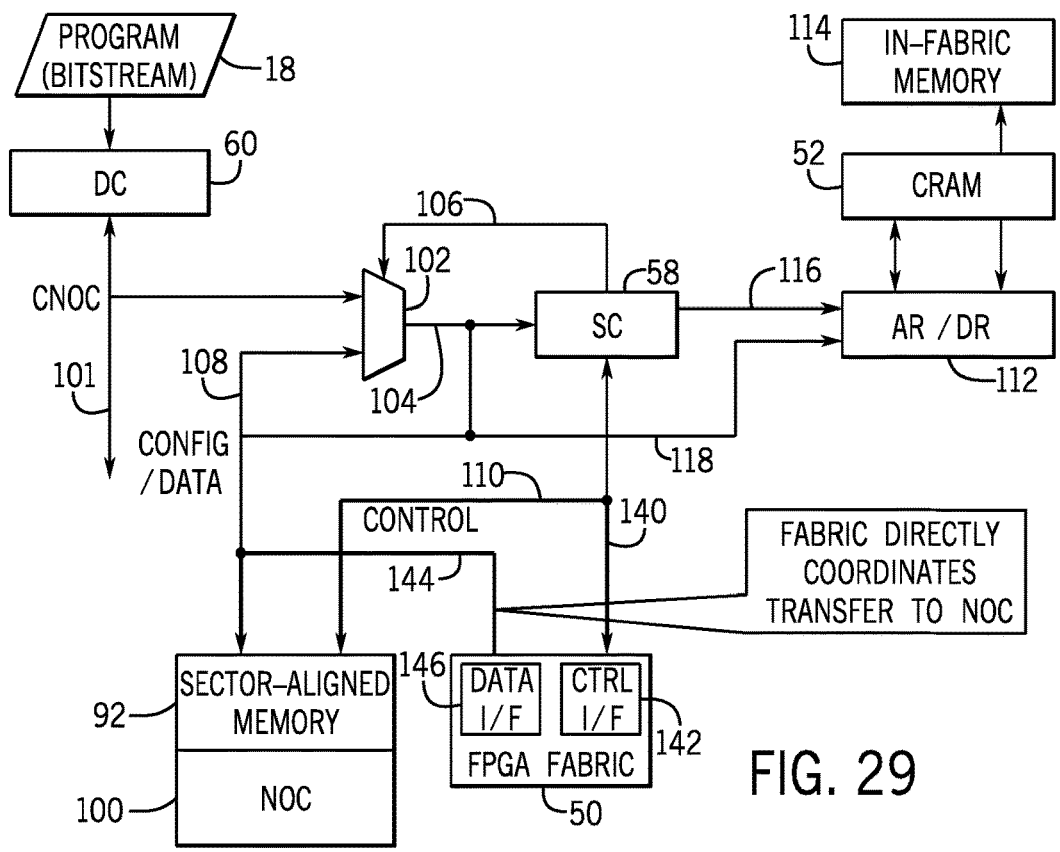
FIG. 29 is a block diagram illustrating an example of directly transferring data from the programmable logic fabric to the embedded NOC circuitry using the circuitry of FIG. 11, in accordance with an embodiment.
Figure 30:
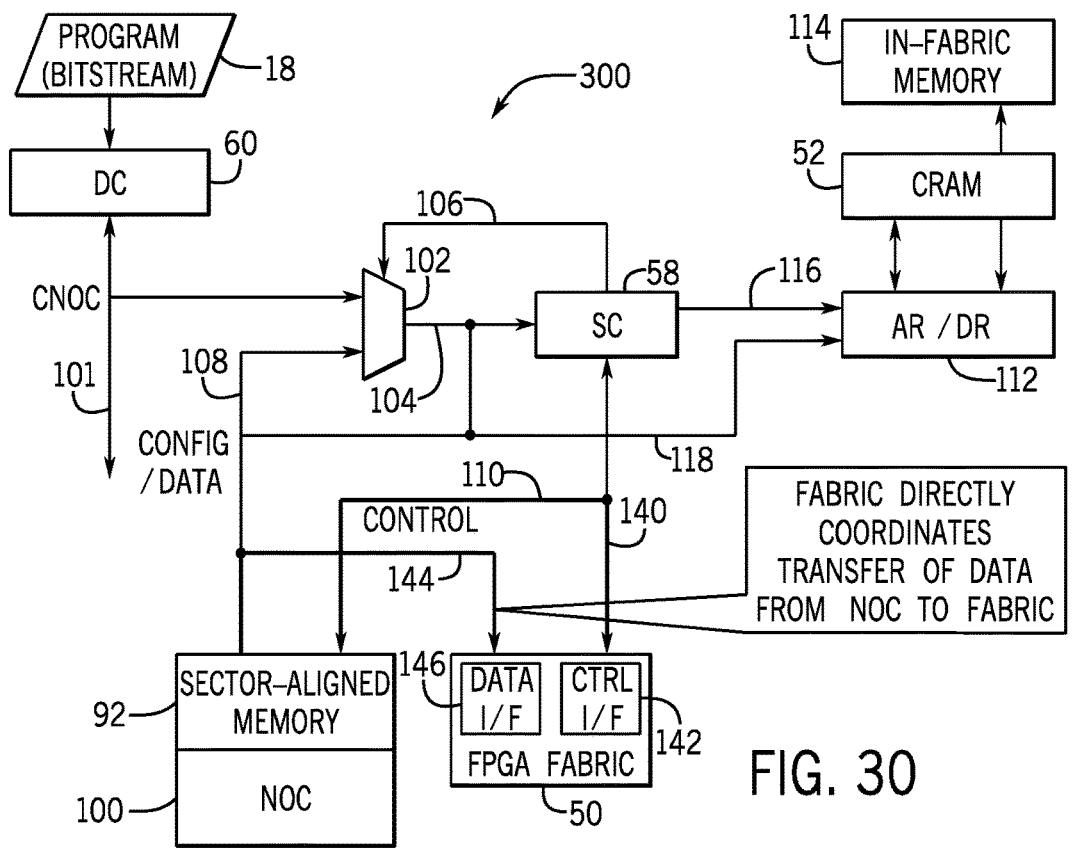
FIG. 30 is a block diagram illustrating an example of directly transferring data from the embedded NOC circuitry to the programmable logic fabric using the circuitry of FIG. 11, in accordance with an embodiment.

In certain embodiments, the FPGA fabric 50 may forgo using the sector controller (SC) 58 with regard to data transfers directly between the FPGA fabric 50 and the NOC 100. For example, FIG. 29 represents another example of a data transfer from the FPGA fabric 50 and/or registers of the programmable logic elements 50 to the NOC 100 using the circuitry 132 described above with reference to FIG. 11. Additionally, FIG. 30 represents an example of a data transfer from the NOC 100 to the FPGA fabric 50 and/or registers of the programmable logic elements 50 using the circuitry 132. As such, additional description of elements with the same numbering as those in FIG. 12 may be found in the text above. Here, the configuration program 20, control circuitry such as a soft or hardened controller implemented in the programmable logic elements 50, and/or the control interface (CTRL I/F) 142 and the data interface (DATA I/F) 146 may coordinate data transfer from the FPGA fabric 50 and/or registers of the programmable logic elements 50 to the NOC 100, as depicted in FIG. 29, or from the NOC 100 to the FPGA fabric 50 and/or registers of the programmable logic elements 50, as depicted in FIG. 30. The data from the FPGA fabric 50 and/or registers of the programmable logic elements 50 may be transferred between the data interface (DATA I/F) 146 to the NOC 100 using the data pathway 144 under instruction from control signals on the control pathway 140 by the control interface (CTRL I/F) 142.

Figure 31:
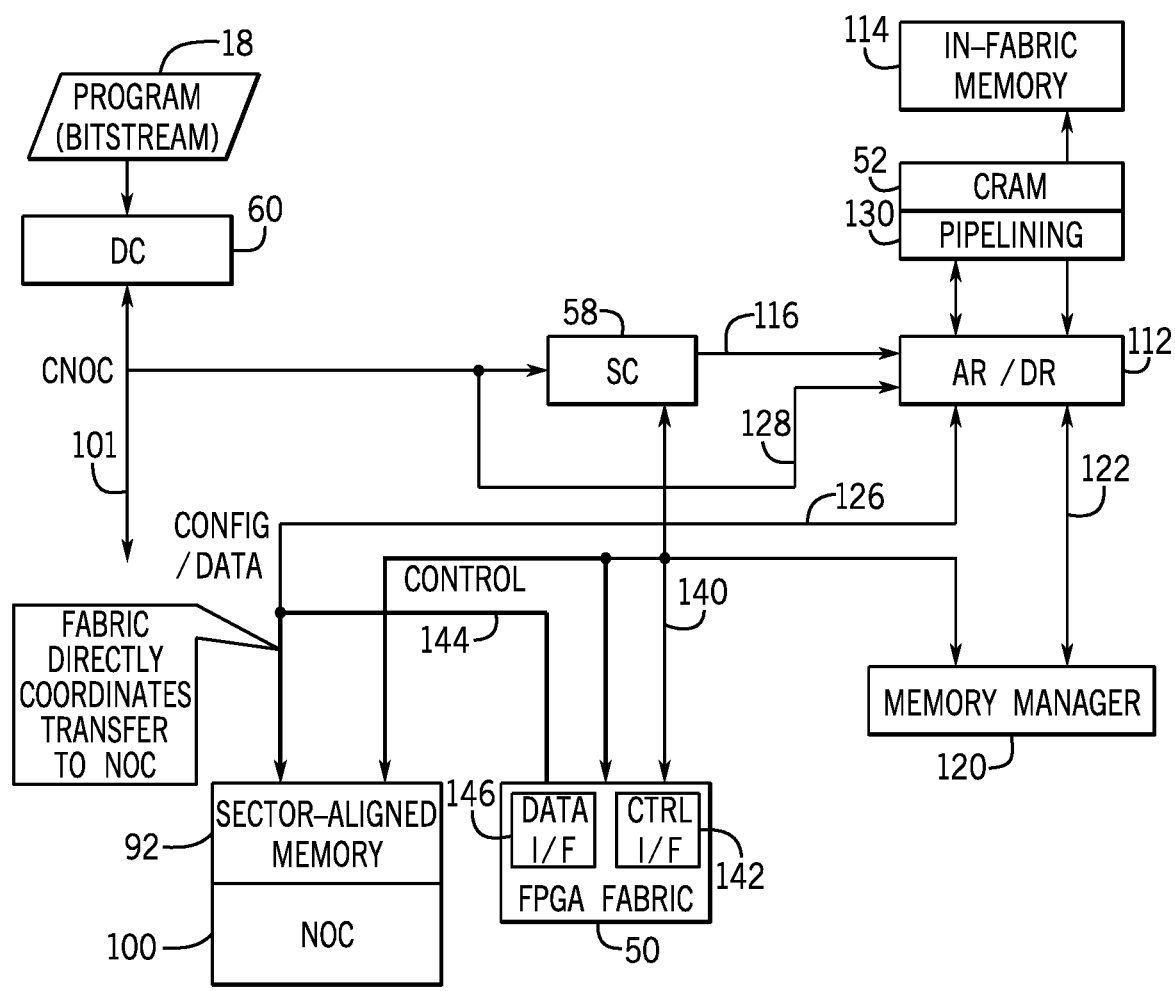
FIG. 31 is a block diagram illustrating an example of directly transferring data from the programmable logic fabric to the embedded NOC circuitry using the circuitry of FIG. 12, in accordance with an embodiment.

FIG. 31 represents another example of a data transfer from the FPGA fabric 50 and/or registers of the programmable logic elements 50 to the NOC 100 using the circuitry 134 described above with reference to FIG. 12. As such, additional description of elements with the same numbering as those in FIG. 12 may be found in the text above. Here, the configuration program 20, control circuitry such as a soft or hardened controller implemented in the programmable logic elements 50, and/or the control interface (CTRL I/F) 142 and the data interface (DATA I/F) 146 may coordinate data transfer from FPGA fabric 50 and/or registers of the programmable logic elements 50 to the NOC 100. The data from the NOC 100 may be transferred to the data interface (DATA I/F) 146 to the NOC 100 using the data pathway 144 under instruction from control signals on the control pathway 140 by the control interface (CTRL I/F) 142, and subsequently programmed into the FPGA fabric 50 and/or registers of the programmable logic elements 50.

Figure 32:
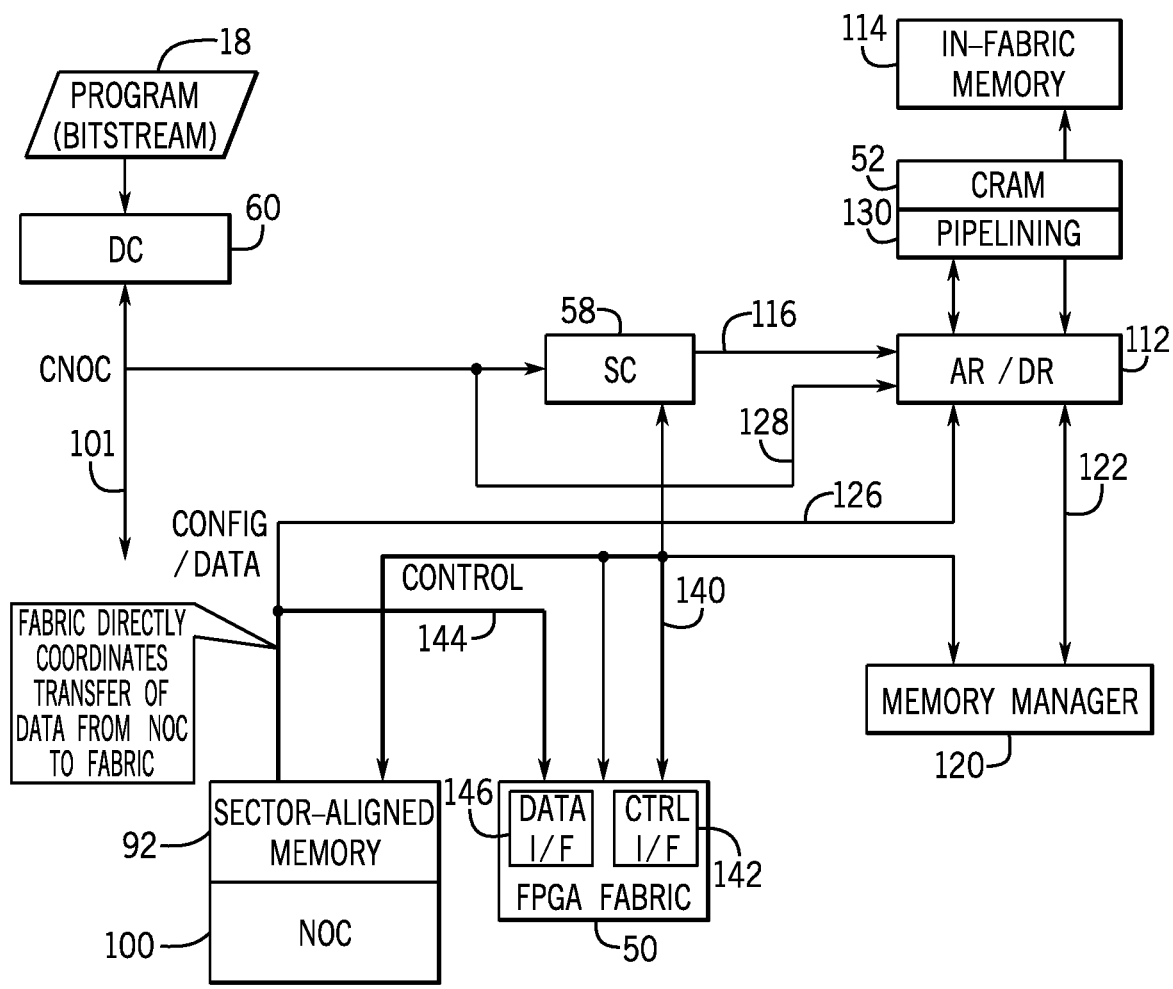
FIG. 32 is a block diagram illustrating an example of directly transferring data from the embedded NOC circuitry to the programmable logic fabric using the circuitry of FIG. 12, in accordance with an embodiment.

In the same manner, FIG. 32 represents another example of a data transfer from the NOC 100 to the FPGA fabric 50 and/or registers of the programmable logic elements 50 using the circuitry 134. As shown in FIG. 32, the configuration program 20, control circuitry such as a soft or hardened controller implemented in the programmable logic elements 50, and/or the control interface (CTRL I/F) 142 and the data interface (DATA I/F) 146 may coordinate data transfer from the NOC 100 to the FPGA fabric 50 and/or registers of the programmable logic elements 50. The data from the NOC 100 to the FPGA fabric 50 and/or registers of the programmable logic elements 50 may be transferred between the data interface (DATA I/F) 146 using the data pathway 144 under instruction from control signals on the control pathway 140 by the control interface (CTRL I/F) 142.

With the foregoing in mind, it should be noted that the fabric sectors 80 may initiate a transfer of data directly between memory locations of the sector-aligned memory 92 of the base die 24 using the NOC 100, between different fabric sectors 80 of the fabric die 22, between fabric sectors 80 and memory locations of the sector-aligned memory 92, and the like. In certain embodiments, the sector controller (SC) 58 may initiate the transfer of data between sectors 80 of the fabric die 22, between memory locations of the sector-aligned memory 92, between sectors 80 of the fabric die 22 and memory locations of the sector-aligned memory 92, and the like. That is, the sector controller (SC) 58 may coordinate the operation of the NOC 100 to facilitate the transfer of the data between the source and destination targets, as specified by the section controller (SC) 58. In some embodiments, the section controller (SC) 58 may act as a master to initiate the respective transfer and the transfer would then be performed using the NOC 100 after the section controller (SC) 58 initiates the data transfer process.

Figure 33:
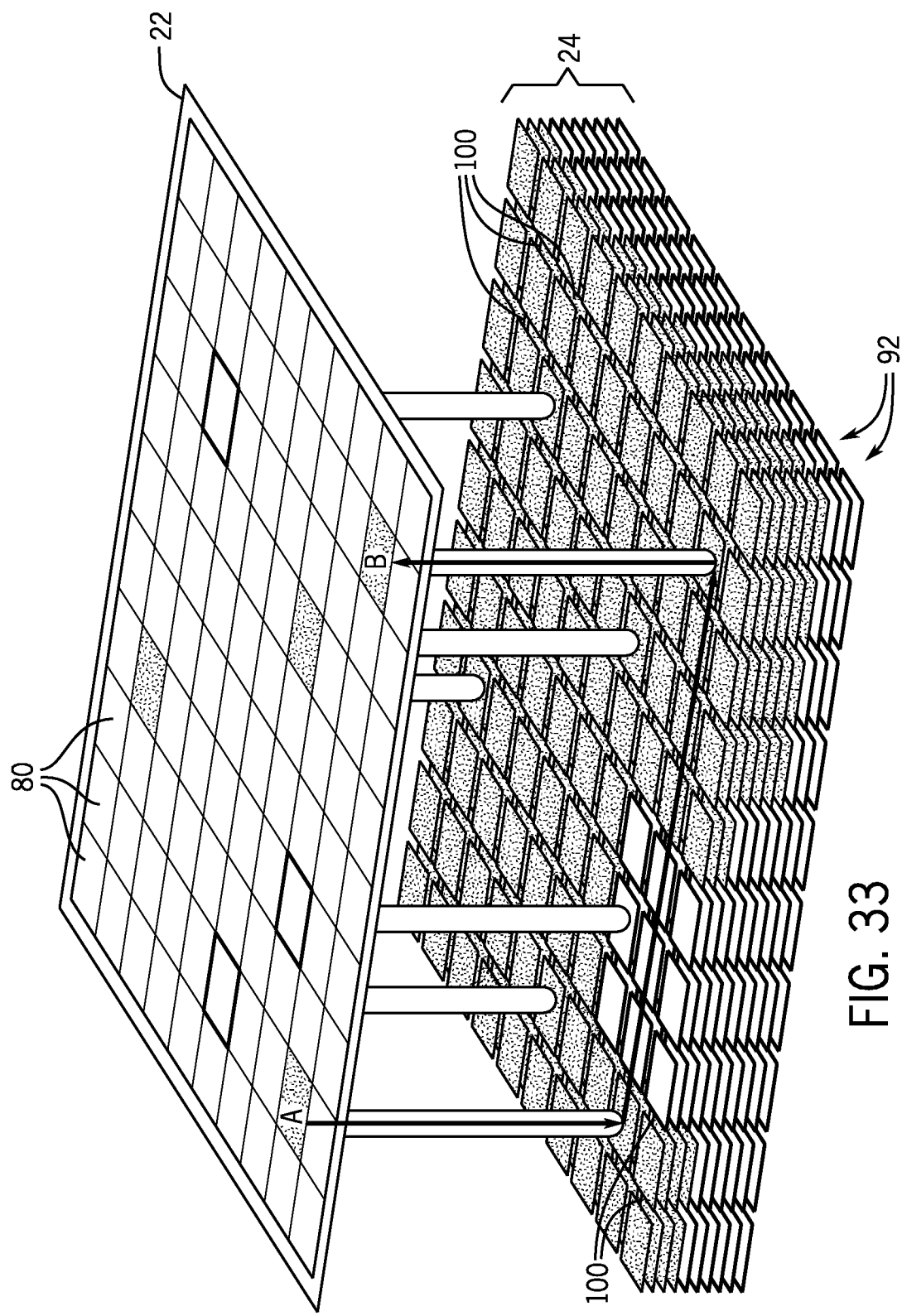
FIG. 33 is a block diagram illustrating an example of transferring data between sectors of the programmable logic fabric via the embedded NOC circuitry of the base die, in accordance with an embodiment.

By way of example, FIG. 33 includes a block diagram of illustrating the transfer of data between sectors 80 of the programmable logic fabric via the NOC circuitry 100 of the base die 24. Referring to FIG. 33, in one embodiment, the sector controller (SC) 58 may initiate a transfer of data from sector "A" to sector "B" of the fabric die 22 using the NOC 100 of the base die 24. That is, the sector controller (SC) 58 may transfer data to a region of the sector-aligned memory 92 aligned with sector "A" of the fabric die 22, use the NOC 100 to transfer the data to a second region of the sector-aligned memory 92 aligned with sector "B" of the fabric die 22, and transfer the data from the second region of the sector-aligned memory 92 to sector "B" of the fabric die 22. Although the route of the data transfer illustrated in FIG. 33 corresponds to straight paths, it should be noted that the data transferred to different sectors 80 of the fabric die 22 or regions of the sector-aligned memory 92 may use a variety of directions and routes.

Figure 34:
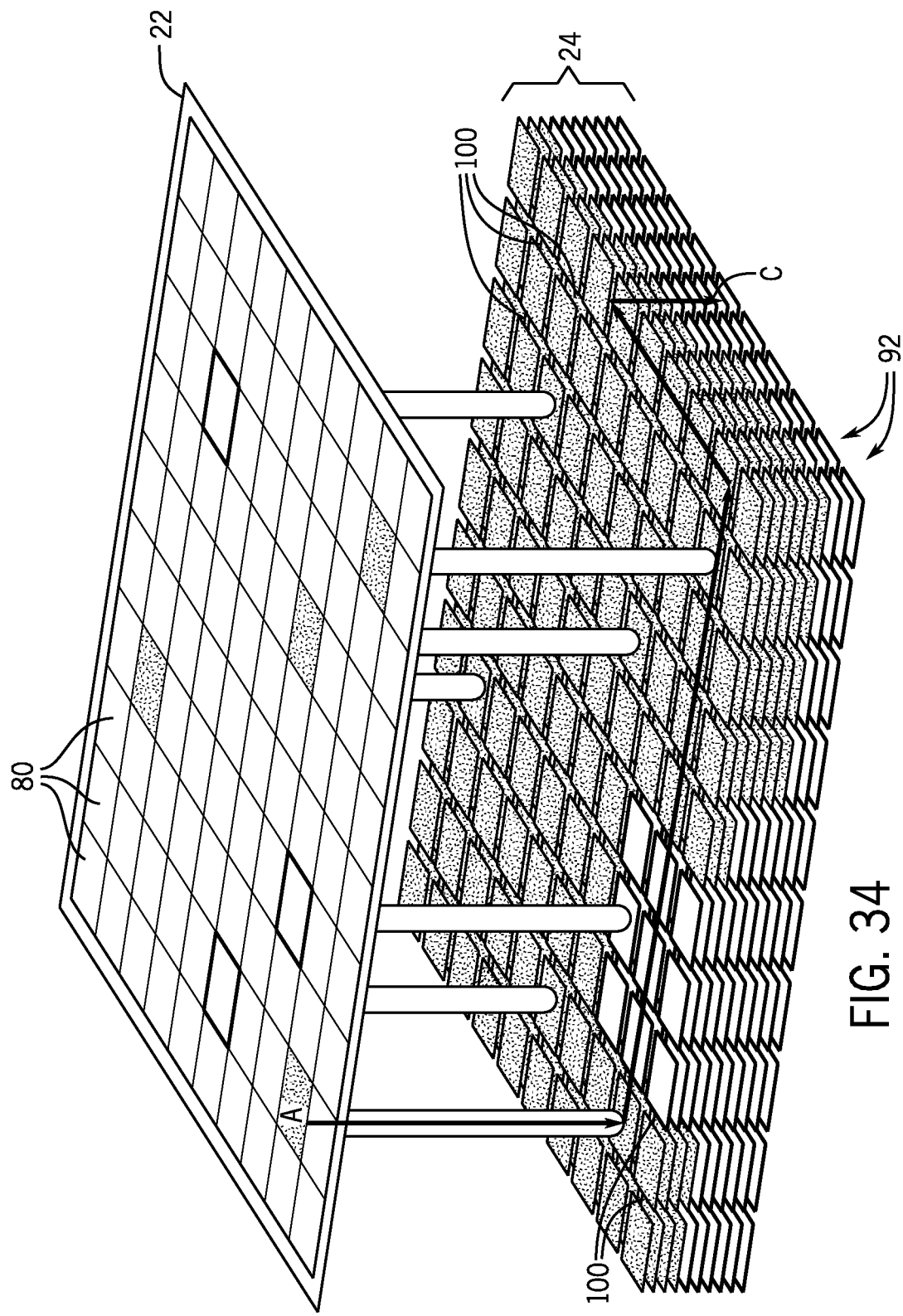
FIG. 34 is a block diagram illustrating an example of transferring data from a sector of the programmable logic fabric to a memory of the sector-aligned memory in the base die via the embedded NOC circuitry, in accordance with an embodiment.
Figure 35:
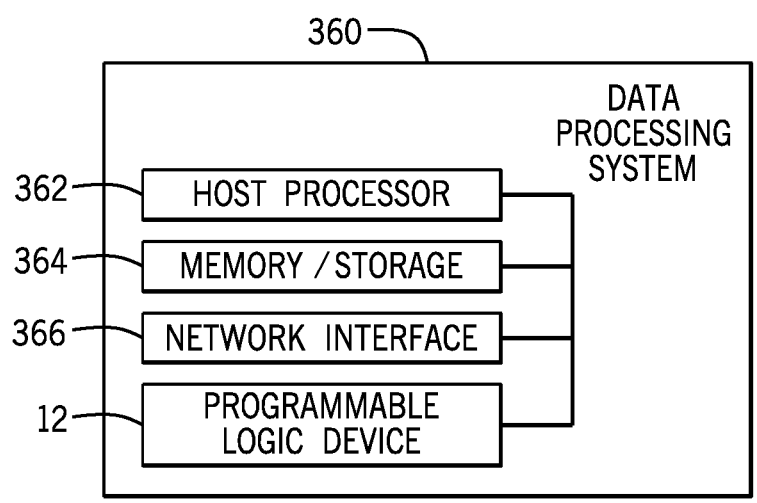
FIG. 35 is a block diagram of a data processing system that may use the programmable logic device to rapidly respond to data processing requests, in accordance with an embodiment.

In another example, FIG. 34 includes a block diagram of illustrating the transfer of data between a sector 80 of the programmable logic fabric to a region of the sector-aligned memory 92 via the NOC circuitry 100 of the base die 24. Referring to FIG. 34, in one embodiment, the sector controller (SC) 58 may initiate a transfer of data from sector "A" of the fabric die 22 to region "C" of the sector-aligned memory 92 using the NOC 100 of the base die 24. That is, the sector controller (SC) 58 may transfer data to a first region of the sector-aligned memory 92 aligned with sector "A" of the fabric die 22 and use the NOC 100 to transfer the data to region "C" of the sector-aligned memory 92 via different regions of the sector-aligned memory 92 or the like. Like FIG. 33, although the route of the data transfer illustrated in FIG. 34 corresponds to straight paths, it should be noted that the data transferred to different regions of the sector-aligned memory 92 may use a variety of directions and routes. In addition, in certain embodiments, the transfer of data described herein may employ the circuitry 132 and the circuitry 134 described above with reference to FIGS. 9 and 10. However, it should be noted that other suitable circuits may also be employed to transfer the data in accordance with the embodiments presented herein.

As shown in FIGS. 31 and 33, the sector controller (SC) 58 may initiate a transfer of data directly between memory locations within the base die 24 using the NOC system 100. In this case, the sector controller (SC) 58 may act as the master to initiate the transfer, but then the transfers would be performed directly in the sector-aligned memory 92 and the NOC system 100 of the base die 24 after the sector controller (SC) 58 initiates the transfer.

It should also be mentioned that, in some embodiments, that the sector controller (SC) 58 and similar components of the fabric die 22 may also initiate the components (e.g., memory control circuitry 93, non-user input control circuitry 94, non-user output control circuitry 95) of the base die 24 to perform transfers between the sector-aligned memory 92, the peripheral circuitry 28, and other components attached to the base die. As a result, data transfers may occur in the base die 24 without involvement of components in the fabric die 22.

The programmable logic device 12 may be, or may be a component of, a data processing system. For example, the programmable logic device 12 may be a component of a data processing system 360, shown in FIG. 35. The data processing system 360 includes a host processor 362, memory and/or storage circuitry 364, and a network interface 366. The data processing system 360 may include more or fewer components (e.g., electronic display, user interface structures, application specific integrated circuits (ASICs)). The host processor 362 may include any suitable processor, such as an Intel® Xeon® processor or a reduced-instruction processor (e.g., a reduced instruction set computer (RISC), an Advanced RISC Machine (ARM) processor) that may manage a data processing request for the data processing system 360 (e.g., to perform machine learning, video processing, voice recognition, image recognition, data compression, database search ranking, bioinformatics, network security pattern identification, spatial navigation, or the like). The memory and/or storage circuitry 364 may include random access memory (RAM), read-only memory (ROM), one or more hard drives, flash memory, or the like. The memory and/or storage circuitry 364 may be considered external memory to the programmable logic device 12 and may hold data to be processed by the data processing system 360. In some cases, the memory and/or storage circuitry 364 may also store configuration programs (bitstreams) for programming the programmable logic device 12. The network interface 366 may allow the data processing system 360 to communicate with other electronic devices. The data processing system 360 may include several different packages or may be contained within a single package on a single package substrate.

In one example, the data processing system 360 may be part of a data center that processes a variety of different requests. For instance, the data processing system 360 may receive a data processing request via the network interface 366 to perform machine learning, video processing, voice recognition, image recognition, data compression, database search ranking, bioinformatics, network security pattern identification, spatial navigation, or some other specialized task. The host processor 362 may cause the programmable logic fabric of the programmable logic device 12 to be programmed with a particular accelerator related to requested task. For instance, the host processor 362 may instruct that configuration data (bitstream) stored on the memory/storage 364 or cached in sector-aligned memory of the programmable logic device 12 to be programmed into the programmable logic fabric of the programmable logic device 12. The configuration data (bitstream) may represent a circuit design for a particular accelerator function relevant to the requested task. Due to the high density of the programmable logic fabric, the proximity of the substantial amount of sector-aligned memory to the programmable logic fabric, or other features of the programmable logic device 12 that are described here, the programmable logic device 12 may rapidly assist the data processing system 260 in performing the requested task. Indeed, in one example, an accelerator may assist with a voice recognition task less than a few milliseconds (e.g., on the order of microseconds) by rapidly accessing and processing large amounts of data in the accelerator using sector-aligned memory.

The methods and devices of this disclosure may be incorporated into any suitable circuit. For example, the methods and devices may be incorporated into numerous types of devices such as microprocessors or other integrated circuits. Exemplary integrated circuits include programmable array logic (PAL), programmable logic arrays (PLAs), field programmable logic arrays (FPLAs), electrically programmable logic devices (EPLDs), electrically erasable programmable logic devices (EEPLDs), logic cell arrays (LCAs), field programmable gate arrays (FPGAs), application specific standard products (ASSPs), application specific integrated circuits (ASICs), and microprocessors, just to name a few.

Moreover, while the method operations have been described in a specific order, it should be understood that other operations may be performed in between described operations, described operations may be adjusted so that they occur at slightly different times or described operations may be distributed in a system which allows the occurrence of the processing operations at various intervals associated with the processing, as long as the processing of overlying operations is performed as desired.

The embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

EXAMPLE EMBODIMENTS OF THE DISCLOSURE

The following numbered clauses define certain example embodiments of the present disclosure.

Clause 1.

An integrated circuit device comprising:

programmable logic fabric disposed on a first integrated circuit die, wherein the programmable logic fabric comprises a first region of programmable logic fabric, wherein the first region of programmable logic fabric is configured to be programmed with a circuit design that operates on a first set of data; and network on chip (NOC) circuitry disposed on a second integrated circuit die, wherein the NOC circuitry is configured to communicate data between the first integrated circuit die and the second integrated circuit die.

Clause 2.

The integrated circuit device of clause 1, wherein the NOC circuitry is directly accessible by the first region of programmable logic fabric.

Clause 3.

The integrated circuit device of clause 1, wherein the NOC circuitry is configured to communicate a second set of data to peripheral circuitry configured to couple to the second integrated circuit die.

Clause 4.

The integrated circuit device of clause 1, wherein the NOC circuitry is configured to communicate a second set of data from the first region of programmable logic fabric to a second region of programmable logic fabric, wherein a plurality of powered down regions is disposed between the first region of programmable logic fabric and the second region of programmable logic fabric on the first integrated circuit die.

Clause 5.

The integrated circuit device of clause 1, comprising a region-aligned memory disposed on the second integrated circuit die, wherein the region-aligned memory comprises a first region of region-aligned memory directly accessible by the first region of programmable logic fabric and a second region of region-aligned memory directly accessible by a second region of programmable logic fabric.

Clause 6.

The integrated circuit device of clause 5, wherein the first region of region-aligned memory is configured to store the first set of data; wherein the NOC circuitry is disposed between the first region of the region-aligned memory and the second region of the region-aligned memory.

Clause 7.

The integrated circuit device of clause 1, wherein the programmable logic fabric comprises a third region comprising a region controller configured to coordinate transfer of the data between configuration memory of the programmable logic fabric and the NOC circuitry.

Clause 8.

The integrated circuit device of clause 7, wherein the configuration memory comprises configuration random access memory configured to define one or more operations of a plurality of regions of the programmable logic fabric.

Clause 9.

The integrated circuit device of clause 1, wherein the programmable logic fabric comprises a third region comprising a region controller configured to coordinate transfer of the data between configuration memory of the programmable logic fabric and the NOC circuitry by delegating the transfer of the data to a manager component configured to control one or more data transfers between a data register of the programmable logic fabric and the NOC circuitry via a data pathway.

Clause 10.

The integrated circuit device of clause 1, wherein the programmable logic fabric comprises a third region comprising a region controller configured to coordinate transfer of the data between in-fabric memory of the programmable logic fabric and the NOC circuitry.

Clause 11.

The integrated circuit device of clause 10, wherein the region controller is configured to coordinate the transfer of the data via a data register of the programmable logic fabric.

Clause 12.

The integrated circuit device of clause 1, wherein the programmable logic fabric is configured to directly transfer the data between at least two of a plurality of regions of the programmable logic fabric via the NOC circuitry.

Clause 13.

A programmable logic device comprising: a plurality of regions of programmable logic fabric disposed in a first integrated circuit die, wherein the plurality of regions comprises a first set of programmable logic elements controlled by a respective set of configuration memory cells;

network on chip (NOC) circuitry disposed in a second integrated circuit die, wherein the NOC circuitry is connected to at least one of the plurality of regions of programmable logic fabric via a physical connection, wherein the NOC circuitry is configured to communicate data between the first integrated circuit die and the second integrated circuit die via the physical connection.

Clause 14.

The programmable logic device of clause 13, comprising: a first region of a region-aligned memory disposed in the second integrated circuit die, wherein the first region of the region-aligned memory is connected to a first region of the plurality of regions of programmable logic fabric via the physical connection; and a second region of the region-aligned memory disposed in the second integrated circuit die, wherein the second region of the region-aligned memory is connected to a second region of the plurality of regions of programmable logic fabric via an additional physical connection distinct from the physical connection, and wherein the first integrated circuit die and the second integrated circuit die are vertically stacked, such that the first region is aligned with the first region of the region-aligned memory and the second region is aligned with the second region of the region-aligned memory.

Clause 15.

The programmable logic device of clause 13, wherein the NOC circuitry is disposed between the first region of the region-aligned memory and the second region of the region-aligned memory.

Clause 16.

The programmable logic device of clause 13, wherein one of the plurality of regions comprises a section controller configured to coordinate transfer of the data between configuration memory of the programmable logic fabric and the NOC circuitry.

Clause 17.

The programmable logic device of clause 13, wherein one of the plurality of regions comprises a section controller configured to coordinate transfer of the data between the set of configuration memory cells and the NOC circuitry.

Clause 18.

The programmable logic device of clause 13, wherein one of the plurality of regions comprises a region controller configured to coordinate transfer of the data between the set of configuration memory cells and the NOC circuitry by delegating the transfer of the data to a memory manager component configured to control one or more data transfers between a data register of the programmable logic fabric and the NOC circuitry via the physical connection.

Clause 19.

The programmable logic device of clause 13, wherein one of the plurality of regions comprises a region controller configured to coordinate transfer of the data between in-fabric memory of the programmable logic fabric and the NOC circuitry.

Clause 20.

The programmable logic device of clause 19, wherein the region controller is configured to coordinate the transfer of the data via a data register of the programmable logic fabric.

Clause 21.

The programmable logic device of clause 21, wherein one of the plurality of regions comprises a region controller configured to coordinate transfer of the data between in-fabric memory of the programmable logic fabric and the NOC circuitry by delegating the transfer of the data to a memory manager component configured to control one or more data transfers between a data register of the programmable logic fabric and the NOC circuitry via the physical connection.

Clause 22.

The programmable logic device of clause 13, wherein the programmable logic fabric is configured to directly transfer the data between a first set of regions of the plurality of regions of the programmable logic fabric and the NOC circuitry.

Clause 23.

A method for operating a programmable logic device, the method comprising:
 requesting, by a circuit design implemented in a first region of programmable logic fabric on a first integrated circuit die, a data transfer from the first region of programmable logic fabric to network on chip (NOC) circuitry disposed on a second integrated circuit die; and
 in response to the request, using region control circuitry disposed in the first integrated circuit die, carrying out the data transfer from the first region of programmable logic fabric to the NOC circuitry disposed on the second integrated circuit die via a data path.

Clause 24.

The method of clause 23, wherein the data path comprises a direct connection between the first set of regions of the programmable logic fabric and the NOC circuitry.

What is claimed is:

1. An integrated circuit device comprising:
 programmable logic fabric disposed on a first integrated circuit die, wherein the programmable logic fabric comprises a first region of programmable logic fabric, wherein the first region of programmable logic fabric is configured to be programmed with a circuit design that operates on a first set of data; and
 network on chip (NOC) circuitry disposed on a second integrated circuit die, wherein the NOC circuitry is configured to communicate data between the first integrated circuit die and the second integrated circuit die while at least one powered-down region of programmable logic fabric is disposed between the first region of programmable logic fabric and a second region of programmable logic fabric on the first integrated circuit die.

2. The integrated circuit device of claim 1, wherein the NOC circuitry is directly accessible by the first region of programmable logic fabric.

3. The integrated circuit device of claim 1, wherein the NOC circuitry is configured to communicate a second set of data to peripheral circuitry configured to couple to the second integrated circuit die.

4. The integrated circuit device of claim 1, wherein the at least one powered-down region is one of a plurality of powered down regions disposed between the first region of programmable logic fabric and the second region of programmable logic fabric on the first integrated circuit die.

5. The integrated circuit device of claim 1, comprising a region-aligned memory disposed on the second integrated circuit die, wherein the region-aligned memory comprises a first region of region-aligned memory directly accessible by the first region of programmable logic fabric and a second region of region-aligned memory directly accessible by a second region of programmable logic fabric.

6. The integrated circuit device of claim 5, wherein the first region of region-aligned memory is configured to store the first set of data; and wherein the NOC circuitry is disposed between the first region of the region-aligned memory and the second region of the region-aligned memory.

7. The integrated circuit device of claim 1, wherein the programmable logic fabric comprises a third region comprising a region controller configured to coordinate transfer of the data between configuration memory of the programmable logic fabric and the NOC circuitry.

8. The integrated circuit device of claim 7, wherein the configuration memory comprises configuration random access memory configured to define one or more operations of a plurality of regions of the programmable logic fabric.

9. The integrated circuit device of claim 1, wherein the programmable logic fabric comprises a third region comprising a region controller configured to coordinate transfer of the data between configuration memory of the programmable logic fabric and the NOC circuitry by delegating the transfer of the data to a manager component configured to control one or more data transfers between a data register of the programmable logic fabric and the NOC circuitry via a data pathway.

10. The integrated circuit device of claim 1, wherein the programmable logic fabric comprises a third region comprising a region controller configured to coordinate transfer of the data between in-fabric memory of the programmable logic fabric and the NOC circuitry.

11. An integrated circuit device comprising:
 programmable logic fabric disposed on a first integrated circuit die, wherein the programmable logic fabric comprises a first region of programmable logic fabric, wherein the first region of programmable logic fabric is configured to be programmed with a circuit design that operates on a first set of data; and
 network on chip (NOC) circuitry disposed on a second integrated circuit die, wherein the NOC circuitry is configured to communicate data between the first integrated circuit die and the second integrated circuit die, wherein the programmable logic fabric comprises a third region comprising a region controller configured to coordinate transfer of the data between in-fabric memory of the programmable logic fabric and the NOC circuitry, and wherein the region controller is configured to coordinate the transfer of the data via a data register of the programmable logic fabric.

12. The integrated circuit device of claim 1, wherein the programmable logic fabric is configured to directly transfer the data between at least two of a plurality of regions of the programmable logic fabric via the NOC circuitry.

13. A programmable logic device comprising:
 a plurality of regions of programmable logic fabric disposed in a first integrated circuit die, wherein the plurality of regions comprises a first set of programmable logic elements controlled by a respective set of configuration memory cells; and
 network on chip (NOC) circuitry disposed in a second integrated circuit die, wherein the NOC circuitry is connected to at least one of the plurality of regions of programmable logic fabric via a physical connection, wherein the NOC circuitry is configurable to communicate data between the first integrated circuit die and the second integrated circuit die via the physical connection,
 wherein at least one of the plurality of regions comprises a region controller configurable to coordinate transfer of the data between the set of configuration memory cells or in-fabric memory and the NOC circuitry by delegating the transfer of the data to a memory manager component configured to control one or more data transfers between a data register of the programmable logic fabric and the NOC circuitry via the physical connection.

14. The programmable logic device of claim 13, comprising:
a first region of a region-aligned memory disposed in the second integrated circuit die, wherein the first region of the region-aligned memory is connected to a first region of the plurality of regions of programmable logic fabric via the physical connection; and
a second region of the region-aligned memory disposed in the second integrated circuit die, wherein the second region of the region-aligned memory is connected to a second region of the plurality of regions of programmable logic fabric via an additional physical connection distinct from the physical connection, and wherein the first integrated circuit die and the second integrated circuit die are vertically stacked, such that the first region is aligned with the first region of the region-aligned memory and the second region is aligned with the second region of the region-aligned memory.

15. The programmable logic device of claim 14, wherein the NOC circuitry is disposed between the first region of the region-aligned memory and the second region of the region-aligned memory.

16. The programmable logic device of claim 13, wherein one of the plurality of regions comprises a section controller configured to coordinate transfer of the data between configuration memory of the programmable logic fabric and the NOC circuitry.

17. The programmable logic device of claim 13, wherein one of the plurality of regions comprises a section controller configured to coordinate transfer of the data between the set of configuration memory cells and the NOC circuitry.

18. The programmable logic device of claim 13, wherein one of the plurality of regions comprises a region controller configured to coordinate transfer of the data between in-fabric memory of the programmable logic fabric and the NOC circuitry.

19. The programmable logic device of claim 18, wherein the region controller is configured to coordinate the transfer of the data via a data register of the programmable logic fabric.

20. The programmable logic device of claim 13, wherein the programmable logic fabric is configured to directly transfer the data between a first set of regions of the plurality of regions of the programmable logic fabric and the NOC circuitry.

21. A method for operating a programmable logic device, the method comprising:
requesting, by a circuit design implemented in a first region of programmable logic fabric on a first integrated circuit die, a data transfer from the first region of programmable logic fabric to network on chip (NOC) circuitry disposed on a second integrated circuit die; and
in response to the request, using region control circuitry disposed in the first integrated circuit die, carrying out the data transfer from the first region of programmable logic fabric to the NOC circuitry disposed on the second integrated circuit die via a data path.

22. The method of claim 21, wherein the data path comprises a direct connection between the first region of the programmable logic fabric and the NOC circuitry.

23. The method of claim 21, comprising transferring the data from the NOC circuitry to peripheral circuitry on the second integrated circuit die.

24. The method of claim 21, comprising transferring the data from the NOC circuitry to region-aligned memory on the second integrated circuit die.

* * * * *